United States Patent
Okada et al.

(10) Patent No.: US 7,893,429 B2
(45) Date of Patent: Feb. 22, 2011

(54) MULTIFUNCTION ORGANIC DIODE AND MATRIX PANEL THEREOF

(75) Inventors: Hiroyuki Okada, Toyama (JP); Shigeki Naka, Nei-gun (JP); Hiroyoshi Onnagawa, Toyama (JP)

(73) Assignee: National University Corporation University of Toyama, Toyama-shi (JP)

( * ) Notice: Subject to any disclaimer, the term of this patent is extended or adjusted under 35 U.S.C. 154(b) by 475 days.

(21) Appl. No.: 11/909,295

(22) PCT Filed: Mar. 1, 2006

(86) PCT No.: PCT/JP2006/303840
§ 371 (c)(1),
(2), (4) Date: Sep. 21, 2007

(87) PCT Pub. No.: WO2006/103863
PCT Pub. Date: Oct. 5, 2006

(65) Prior Publication Data
US 2009/0050878 A1 Feb. 26, 2009

(30) Foreign Application Priority Data
Mar. 25, 2005 (JP) .............................. 2005-088734

(51) Int. Cl.
H01L 35/24 (2006.01)
H01L 51/00 (2006.01)
(52) U.S. Cl. .................. 257/40; 257/E51.028; 313/500
(58) Field of Classification Search ................... 257/40, 257/E51.028; 313/500
See application file for complete search history.

(56) References Cited

U.S. PATENT DOCUMENTS

| | | | | |
|---|---|---|---|---|
| 5,281,489 A | * | 1/1994 | Mori et al. | 428/690 |
| 6,465,648 B1 | * | 10/2002 | Tadokoro et al. | 544/225 |
| 2005/0238910 A1 | * | 10/2005 | Ionkin et al. | 428/690 |

FOREIGN PATENT DOCUMENTS

| | | | |
|---|---|---|---|
| JP | 54-138303 | | 10/1979 |
| JP | 02220394 A | * | 9/1990 |
| JP | 5-259434 | | 10/1993 |
| JP | 7-175420 | | 7/1995 |
| JP | 9-22778 | | 1/1997 |
| JP | 11-284250 | | 10/1999 |
| JP | 2002-111961 | | 4/2002 |
| JP | 2004-260184 | | 9/2004 |

* cited by examiner

Primary Examiner—Eugene Lee
Assistant Examiner—Anthony Ho
(74) Attorney, Agent, or Firm—Oblon, Spivak, McClelland, Maier & Neustadt, L.L.P.

(57) ABSTRACT

Disclosed is organic diode which is capable of light emitting display by an organic EL display, image sensing by a organic photodiode and power generation by an organic solar cell. Also disclosed is a matrix panel of such a multifunction organic diode. Specifically disclosed is a multifunction organic diode comprising a first electrode (12) formed on a substrate (11), an organic thin film (13) formed on the first electrode (12) and having both light emitting and photoconductive properties, and a second electrode (14) formed on the organic thin film (13).

24 Claims, 22 Drawing Sheets

FIG. 17
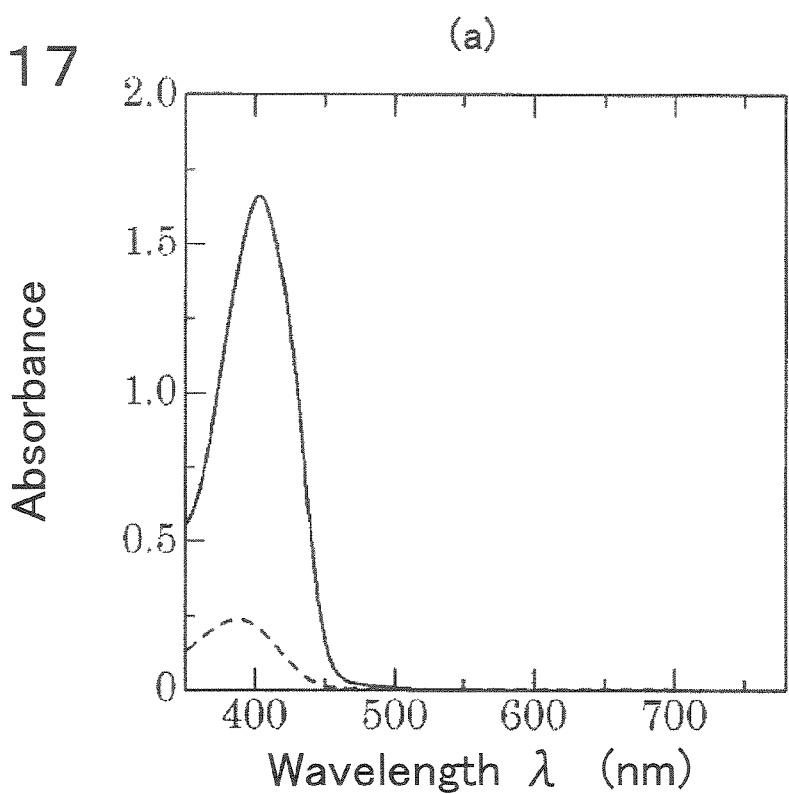
(a)
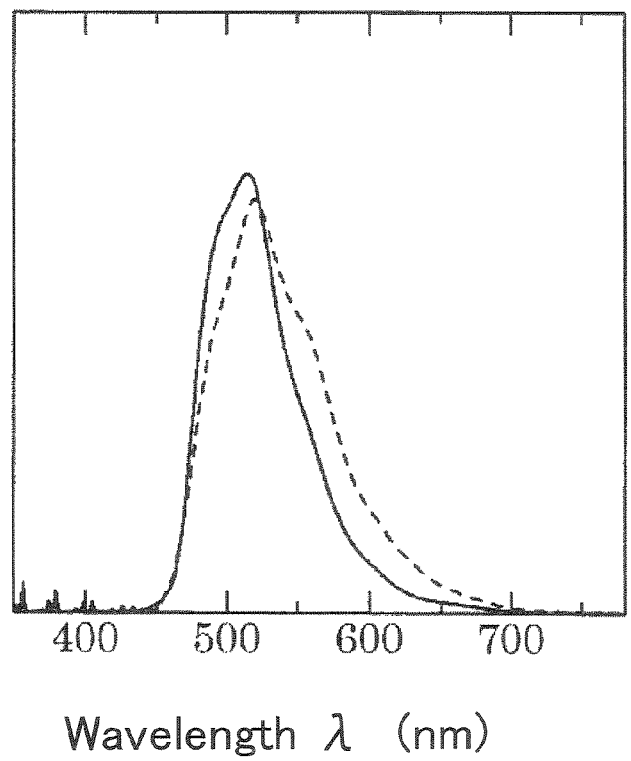
(b)

MULTIFUNCTION ORGANIC DIODE AND MATRIX PANEL THEREOF

TECHNICAL FIELD

The present invention relates to a multifunction organic diode and a matrix panel thereof, and more particularly, to the multifunction organic diode and the matrix panel thereof showing functions as an organic EL, organic photodiode and organic solar cell.

BACKGROUND ART

Conventionally, a main role of devices supporting electronics and information apparatus has been played by a Si semiconductor, and by means of the integrated circuit thereof, development of numerous products such as an electronic apparatus, a computer, a communication apparatus, and a domestic product has been achieved. As drawback of the Si semiconductor, there are, however problems such as that it is not light emitting, that the device size is limited by a wafer size, and that it is heavy. As a result, a compound semiconductor has been developed as a light emitting device, and an amorphous or polycrystal Si semiconductor has been developed as a large area panel.

Due to this situation, a study on an organic device has been developed, which aims at realization of an electronics and information apparatus having features such as large scale, light weight, space-saving, and flexibility. So far the organic material is characterized in a plenty of different material species of more than several millions as well as generation of novel functions, and technological fields such as an organo-electronic photosensitive material and a liquid crystal display device has been established so far. In recent years, aiming at a self light emitting device which is a complement to the liquid crystal display device, an attention is put on an organic EL device, and a development is in progress to realize a small scale display panel. As a subsequent development, a study has started on a novel organic device such as an organic transistor, an organic solar cell and an organic photodiode. Further research and development as well as establishment of a new industry are expected.

The organic EL device, the organic solar cell and the organic photodiode described above are realized from a device having a single or multiple layer structure of an organic material, and, in accordance with the category of the semiconductor device, they belong, in principle, to a diode having a p-n junction, a Schottky junction or the like.

FIG. 1 shows schematically a current-voltage characteristic of an organic diode.

In a dark condition without light irradiation, it exhibits a typical diode characteristic. In the conventional semiconductor device, there exists an ohmic contact at a metal—semiconductor interface, and there also exists carriers, the density thereof being in proportion to the impurity concentration in the semiconductor. On the other hand in the organic material in general, the difference between the highest occupied molecular orbital (HOMO) and the lowest unoccupied molecular orbital (LUMO) is larger than that of the Si semiconductor. Due to this, an interface between a metal and an organic semiconductor is of Schottky type or of a tunnel injection type, and the inside of the semiconductor is a conductive state with much less carrier concentration as compared to a Si semiconductor. Therefore, the expression of the characteristics is different from a Si, nevertheless the current—voltage characteristic is diode—like as same as the Si diode. Referring to FIG. 1, it is understood that the first quadrant is a light emission region of an organic EL device, the third quadrant is an organic photodiode region, and the fourth quadrant is a solar cell region. By taking these points into consideration, it can be contemplated that a device having simultaneously a light emission function and a photo sensing function could be realized. As a matter of fact, by using the same structure as a perylene tetracarboxylic derivative (PV)/copper phthalocyanine (CuPc) structure which C. W. Tang reported in 1986 (Refer to Non-Patent Document 1 below), Adachi reported an observation of light emission phenomenon of "a weak red light" (Refer to Non-Patent Document 2 below). In addition, by considering simultaneously an experimental result on an organic EL device of a conductive polymer (poly([2-methoxy-5-(2'-ethylhexyloxy)]-1,4-phenylenevinylene), MEH-PPV system made by a spray method by Echigo et al., (Refer to Non-Patent Document 3 below) and an experimental result of a top absorption type organic photodiode using the same material by Shimada et al. (Refer to Non-Patent Document 4 below), it can be contemplated that an organic diode having simultaneously a light emission function and a photo sensing function could be realized by using a single layer of the MEH-PPV.

Furthermore, as a stacking structure of a plurality of devices, there is a report by Chikamatsu on the stacking of an organic EL device and an organic photodiode (Refer to Non-Patent Document 6 below). In addition, there was a report given by Time Warner Entertainment Co. L.P. on realizing a light emission and a power generation by a multilayer structure of organic thin films (Refer to Patent Document 1 below), and a report was also given by Tsutsui et al., on an organic semiconductor device characterized in combining a functional film and a conductive thin film layer to improve the device characteristics (Refer to Patent Document 2 below).

[Patent document 1] Japanese Published Unexamined Application 2002-008851.

[Patent document 2] Japanese Published Unexamined Application 2003-264085.

[Non-Patent document 1] C. T. Tang: Appl. Phys. Lett., 48(2), 183, (1986).

[Non-Patent document 2] Adachi: M&BE, 14(4), 205, (2003).

[Non-Patent document 3] Echigo, Naka, Okada, and Onnagawa: "Organic EL device of conductive polymer by a spray method" Extended Abstracts (The 49th Spring Meeting, 2002); The Japan Society of Applied Physics, 27p-YL-16, (2002).

[Non-Patent document 4] Shimada, Naka, Okada, and Onnagawa: "Top absorption type organic photodiode intended for integration" Extended Abstracts (The 51st Spring Meeting, 2004); The Japan Society of Applied Physics, 31a-ZN-13, (2004).

[Non-Patent document 5] Y. Matsushita, H. Shimada, T. Miyashita, M. Shibata, S. Naka, H. Okada and H. Onnagawa: "Organic Bi-function Matrix Array" Extended Abstracts of Solid State Devices and Materials, pp. 168-169, (2004).

[Non-Patent document 6] M. Chikamatsu, Y. Ichino, N. Takada, M. Yoshida, T. Kamata, and K. Yase: Appl. Phys. Lett. 81, (2002), 769.

DISCLOSURE OF INVENTION

When the functions of an organic EL device and an organic photo sensing device is intended to be realized by a single device, it is required from a view point of the light emission device that a visible light emission from the organic material should not be absorbed by the organic material itself, and furthermore that it has a good carrier injection balance which is a feature of a typical organic EL device, a high exciton generation efficiency, and a high internal quantum efficiency. Also from a view point of a photo sensing device it should meet those requirements which are that sufficiently high optical absorption can be attained for an incident radiation with wavelength satisfying the optical absorption band of the organic material itself, that the internal quantum efficiency is high enough for a number of electron-hole pair generated for each incident photon being equal to one and that a carrier transport in the material is efficient enough for the generated carrier to be swept out without being trapped by a band offset, a carrier trap, and the like.

Because many requirements as described above must be satisfied, research and development were conventionally concentrated on improving individual device properties of the organic EL device, the organic solar cell, or the organic photodiode. As for simultaneously realizing the light emission and photo sensing functions, which seems contradictory with each other, there exists only one report published in the Non-Patent Document 2 described above, but nothing has been reported on a device with a luminance as high as 10,000 cd/m² which is practically necessary for light emission device, and with a photoconductivity ratio exceeding $10^3$ which is at least necessary for optical absorption in a photo sensing device.

By taking the situation described above into consideration, the purpose of the present invention is to provide a multifunction organic diode and a matrix panel thereof which are made feasible by combining a light emission display function by an organic EL display, an image sensing function by an organic photodiode, and a power generation function by an organic solar cell.

SUMMARY OF THE INVENTION

To achieve the above objects, the present invention provides:

[1] a multifunction organic diode comprising a first electrode formed on a substrate, an organic thin film formed on the first electrode and having both light emission and photoconductive properties, and a second electrode formed on the organic thin film.

[2] the multifunction organic diode described above in [1], characterized in that a difference between a wavelength of the maximum light emission intensity and a wavelength of the maximum optical absorption of the organic thin film is larger than or equal to sum of the half width in wavelength at half maximum of the light emission and the half width in wavelength at half maximum of the optical absorption.

[3] the multifunction organic diode described above in [1], characterized in that the organic thin film is an organic thin film sequentially stacked with a first organic thin film having a light emission property and a second organic thin film having a photoconductive property.

[4] the multifunction organic diode described above in [3], characterized in that a difference between a wavelength of the maximum light emission intensity of the first organic thin film and a wavelength of the maximum optical absorption of the second organic thin film is larger than or equal to sum of the half width in wavelength at half maximum of the light emission of the first organic thin film and the half width in wavelength at half maximum of the optical absorption of the second organic thin film.

[5] the multifunction organic diode described above in [1], characterized in that the organic thin film is an organic thin film sequentially stacked with a first organic thin film having a photoconductive property and a second organic thin film having a light emission property.

[6] the multifunction organic diode described above in [5], characterized in that a difference between a wavelength of the maximum optical absorption of the first organic thin film and a wavelength of the maximum light emission intensity of the second organic thin film is larger than or equal to sum of the half width in wavelength at half maximum of the optical absorption of the first organic thin film and the half width in wavelength at half maximum of the light emission of the second organic thin film.

[7] the multifunction organic diode described above in [1], characterized in that the organic thin film is an organic thin film of a mixture of a first organic material having a light emission property and a second organic material having a photoconductive property.

[8] the multifunction organic diode described above in [7], characterized in that a difference between a wavelength of the maximum light emission intensity and a wavelength of the maximum optical absorption of the organic thin film of a mixture of the first organic material and the second organic material is larger than or equal to sum of the half width in wavelength at half maximum of the light emission and the half width in wavelength at half maximum of the optical absorption.

[9] the multifunction organic diode described above in [1] or [2], characterized in that, with respect to optical absorption and a film thickness of the organic thin film, the absorption coefficient of the organic thin film for the visible emitting light is less than $2.5 \times 10^4$ cm$^{-1}$ and the maximum absorption coefficient for the absorptive light of the organic thin film is greater than or equal to $2.5 \times 10^4$ cm$^{-1}$, and furthermore a film thickness of the organic thin film is less than or equal to 150 nm.

[10] the multifunction organic diode described above in [1] or [2], characterized in that, with respect to optical absorption and a film thickness of the organic thin film, the absorption coefficient of the organic thin film for the visible emitting light is less than $2.5 \times 10^4$ cm$^{-1}$ or the maximum absorption coefficient of the organic thin film for the absorptive light is greater than or equal to $2.5 \times 10^4$ cm$^{-1}$, and furthermore a film thickness of the organic thin film is less than or equal to 150 nm.

[11] the multifunction organic diode described above in [3] or [4], characterized in that the absorption coefficient of the second organic thin film for the visible emitting light is less than $2.5 \times 10^4$ cm$^{-1}$ and the maximum absorption coefficient of the first organic thin film for the absorptive light is greater than or equal to $2.5 \times 10^4$ cm$^{-1}$, and furthermore the maximum absorption coefficient of the second organic thin film for the absorptive light is greater than or equal to $2.5 \times 10^4$ cm$^{-1}$ and a film thickness of the second organic thin film is less than or equal to 150 nm.

[12] the multifunction organic diode described above in [3] or [4], characterized in that the absorption coefficient of the second organic thin film for the visible emitting light is less than $2.5 \times 10^4$ cm$^{-1}$, or the maximum absorption coefficient of the first organic thin film for the absorptive light is greater than or equal to $2.5 \times 10^4$ cm$^{-1}$, and furthermore a film thickness of the second organic thin film is less than or equal to 150 nm, or that the absorption coefficient of the second organic thin film for the visible emitting light is greater than or equal to $2.5 \times 10^4$ cm$^{-1}$ and furthermore a film thickness of the second organic thin film is less than or equal to 150 nm.

[13] the multifunction organic diode described above in [5] or [6], characterized in that the absorption coefficient of the organic thin film for the visible emitting light is less than

[14] the multifunction organic diode described above in [5] or [6], characterized in that the absorption coefficient of the organic thin film for the visible emitting light is less than $2.5 \times 10^4$ cm$^{-1}$ or the maximum absorption coefficient of the organic thin film for the absorptive light is greater than or equal to $2.5 \times 10^4$ cm$^{-1}$, and furthermore a film thickness of the organic thin film is less than or equal to 150 nm.

[15] the multifunction organic diode described above in [7] or [8], characterized in that the absorption coefficient of the organic thin film for the visible emitting light is less than $2.5 \times 10^4$ cm$^{-1}$ and the maximum absorption coefficient of the organic thin film for the absorptive light is greater than or equal to $2.5 \times 10^4$ cm$^{-1}$, and furthermore a film thickness of the organic thin film is less than or equal to 150 nm.

[16] the multifunction organic diode described above in [7] or [8], characterized in that the absorption coefficient of the organic thin film for the visible emitting light is less than $2.5 \times 10^4$ cm$^{-1}$ or the maximum absorption coefficient of the organic thin film for the absorptive light is greater than or equal to $2.5 \times 10^4$ cm$^{-1}$, and furthermore a film thickness of the organic thin film is less than or equal to 150 nm.

[17] the multifunction organic diode described above in any one of [1], [2], from [7] to [10], [15] and [16], characterized in that an organic thin film with a property of hole transport is included between the organic thin film and the first electrode.

[18] the multifunction organic diode described above in any one of [1], [2], from [7] to [10], [15] and [16], characterized in that an organic thin film with a property of electron transport is included between the organic thin film and the second electrode.

[19] the multifunction organic diode described above in [17], characterized in that an organic thin film which is a mixture of the organic material of said organic thin film and the organic thin film of the hole transport layer having a property of hole transport is used for the entirety or a part of the organic thin film.

[20] the multifunction organic diode described above in [18], characterized in that an organic thin film which is a mixture of the organic material of said organic thin film and an organic thin film of the electron transport layer having a property of electron transport is used for the entirety or a part of the organic thin film.

[21] the multifunction organic diode described above in [1], [2], from [7] to [10], [15], [16], [19] or [20], characterized in that an organic thin film which is a mixture of the organic material of said organic thin film and an organic material having a property as a host material is used for the entirety or a part of the organic thin film.

[22] the multifunction organic diode described above in any one from [1] to [21], characterized in that the first electrode is transparent to a visible light.

[23] the multifunction organic diode described above in any one from [1] to [21], characterized in that the second electrode is transparent to a visible light.

[24] the multifunction organic diode described above in any one from [1] to [21], characterized in that both the first electrode and the second electrode are transparent to a visible light.

[25] the multifunction organic diode described above in any one from [1], [2], from [7] to [10], [19] and [20], characterized in that 4-[2-[5-[4-(Diethylamino)phenyl]-4,5-dihydro-1-phenyl-1H-pyrazol-3-yl]-ethenyl]-N,N-diethylaniline is used for the organic material of the organic thin film.

[26] a multifunction organic diode matrix panel characterized in that the multifunction organic diode described above in any one from [1] to [25] is configured in a matrix form by arranging the first electrode and the second electrode so as to cross with each other, and that driving the matrix and detection of optical information are performed through a peripheral circuit.

[27] a multifunction organic diode matrix panel characterized in that the multifunction organic diode described above in any one from [1] to [25] is configured in a matrix form by arranging the first electrode and the second electrode so as to cross with each other, and that each of the rows of the matrix is sequentially selected, and a current relevant to the image information is changed over/detected by the driving circuit in each column, thereby enabling optical image detection.

[28] a multifunction organic diode matrix panel characterized in that the multifunction organic diode described above in any one from [1] to [25] is used, that light is emitted from the organic diode biased in the forward direction by changing a gate voltage of a first transistor, and that a current in proportion to the incident amount of light is made to flow from the organic diode biased in the reverse direction by changing the gate voltage of the first transistor, thereby the current signal being detected through a second transistor and an outside peripheral circuit.

[29] a multifunction organic diode matrix panel characterized in that the multifunction organic diode described above in any one from [1] to [25] is used, that during a first selected period, a third transistor is made conductive, a second transistor is made as a diode with the threshold voltage of the second transistor being written into the gate part of the second transistor while holding the voltage value by a second storage capacitor, that by applying an analog signal voltage to a gate electrode of a first transistor during a period in which a selection signal is given, the signal voltage is superimposed to the gate voltage of the second transistor through the capacitive coupling of a first capacitor, that during another selected period, the third transistor is made conductive, the second transistor is made as a diode with the threshold voltage of the second transistor being written into the gate part of the second transistor while holding the voltage value by the second capacitor, that by applying an analog signal voltage to the gate electrode of the first transistor during a period in which a selection signal is given, a signal voltage is superimposed through the capacitive coupling of the first capacitor to the gate voltage of the second transistor, thereby making the second transistor conductive, and that the fourth transistor is selected, thereby a current in proportion to the incident amount of light irradiation is made to flow from the organic diode under reverse bias through the second and the fourth transistors, thereby enabling signal detection through an outer peripheral circuit.

[30] a multifunction organic diode matrix panel characterized in that the multifunction organic diode described above in any one from [1] to [25] is used, that in a first selected period, a first transistor and a second transistor are made conductive, and a voltage in proportion to the flowing analog voltage is written into a gate voltage of a third transistor and a first capacitor, that in a second period, a fourth transistor is made conductive and through the third transistor biased in advance, the organic diode biased in the forward direction is made to emit light, and that in another selected period, the first transistor and the second transistor are made conductive, and a voltage in proportion to the flowing analog current is written into a gate voltage of the third transistor and the first capacitor, and the fourth transistor is selected, and a current in proportion to the incident amount of light is made to flow through the organic diode biased in the reverse direction via the third transistor and the fourth transistor, thereby enabling current signal detection through an outside peripheral circuit.

[31] a multifunction organic diode matrix panel characterized in that the multifunction organic diode described above in any one from [1] to [25] is used, that during a period where a first transistor and a third transistor are made conductive, a current data is written into a storage capacitor through a data line using a pinch-off state of a fourth transistor, that the first transistor and the third transistor are made conductive, and a current data is written into the storage capacitor through the data line by making use of the pinch-off state of the fourth transistor, thereby a second transistor and the fourth transistor being made conductive, and that the first transistor and the third transistor are made non-conductive, and a current is made to flow through the second transistor biased in advance, thereby enabling to detect a current from the organic diode biased in the reverse direction.

[32] a multifunction organic diode active matrix panel characterized in that one or more of the organic layers of the multifunction organic diode described above in any one from [1] to [25] is deposited by means of one from or a combination of evaporation, spin coating, ink-jet, spray, bar code, microgravure, brush, CVD methods, As a host material in the above description, following material can be used; (1) 4,4'-N,N-dicarbozole-biphenyl (CBP), (2) 2,9-dimethyl-4,7-diphenyl-1,10-phenanthroline (BCP), (3) Tris(8-hydroxyquinolinato)aluminum(III) ($Alq_3$), (4) aluminum(III)bis(2-methyl-8-quinolinato)4-phenylphenolate (BAlq), (5) triazole compound.

In addition, in the multifunction organic diode, a thin layer with thickness not less than 1 nm is formed in the vicinity of a cathode, the layer being a mixture of the cathode material and the adjacent organic material.

In addition, in the multifunction organic diode, a thin layer with thickness not less than 1 nm is formed in the vicinity of an anode, the layer being a mixture of the anode material and the adjacent organic material.

In addition, in the multifunction organic diode, a thin layer with thickness not less than 1 nm is formed in the vicinity of a cathode, the layer being a mixture of the cathode material and the adjacent organic material, and a thin layer with thickness not less than 1 nm is formed in the vicinity of an anode, the layer being a mixture of the anode material and the adjacent organic material.

BRIEF DESCRIPTION OF THE DRAWINGS

FIG. 17 shows a comparison of a wavelength dependence of (a) absorbance and (b) photoluminescence between various materials in accordance with the present invention.

BEST MODE FOR CARRYING OUT THE INVENTION

The multifunction organic diode in accordance with the present invention comprises a first electrode formed on a substrate, an organic thin film which is formed on the first electrode and has both a light emission property and a photoconductive property, and a second electrode formed on the organic thin film. Therefore a combined function of a light emission display by an organic EL display, an image sensing by an organic photodiode, and a power generation by an organic solar cell is made possible.

Embodiments

Embodiments in accordance with the present invention will be described in the following.

Figure 1:
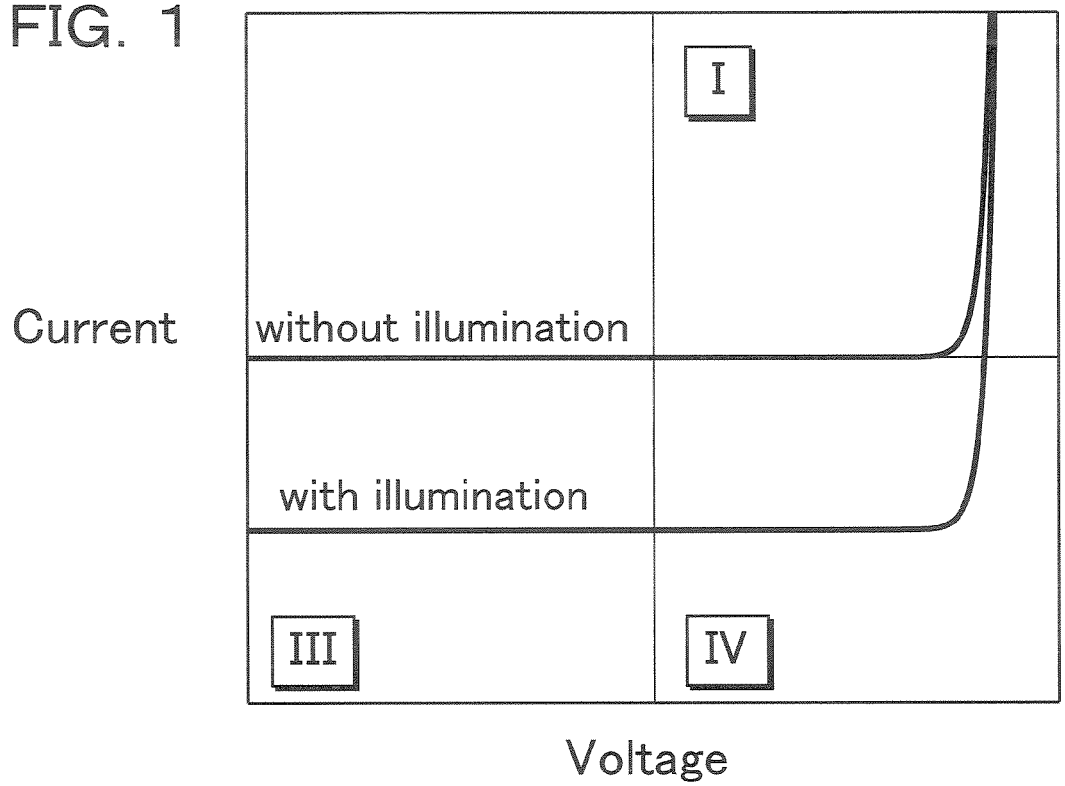
FIG. 1 shows a current—voltage characteristic of an organic diode.
Figure 2:
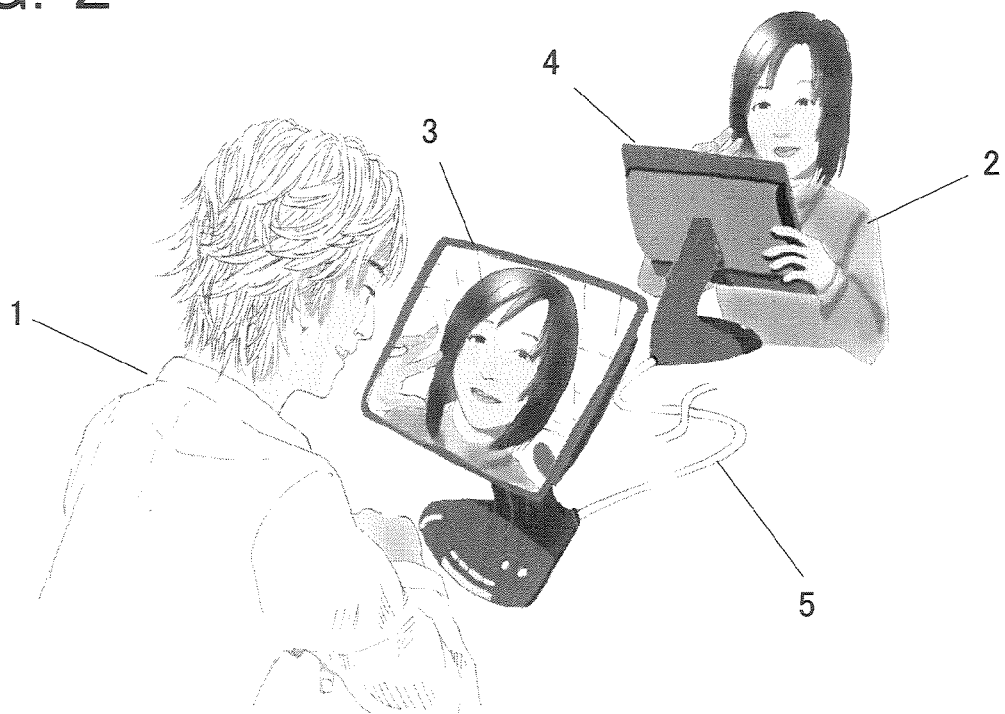
FIG. 2 schematically shows an example of application of the present invention.

FIG. 2 shows an example of a composite function television as an application example implemented by the present invention.

In this figure, 1 is a first observer, 2 is a second observer, 3 is a first display, 4 is a second display, and 5 is a cable.

By alternately performing display and read-in of image information within a frame period with the first display 3 and the second display 4, images of the facing observers are displayed during the display period and read-in through the display during the read-in period of information. Here the image display part/image read-in part performs image display and image read-in, respectively, corresponding to R(red), G(green) and B(blue). Alternatively, the image display part and the image read-in part can be fabricated in a separate position on the surface of the same display. In this case, the image display and the image read-in can be feasible at the same timing. An advantage to arrange the image display part and the image read-in part at a separate position is reduction in cost due to a panel fabrication using the same process. On the other hand, it is accompanied by reduction in aperture ratio and resolution. In the image read-in, a basic type is to read in color information at infinitely far point. In the case when the image display part and the image read-in part are fabricated at a separate position, a lens can be disposed on the substrate by taking the image read-in into account. Furthermore, if peripheral technologies improve in performance, the image read-in becomes possible by using, for example, variable focus liquid crystal display device lens. Furthermore, if the solar cell function improves in performance, power supply through the solar cell will be possible, and a mobile panel with no need for power source or with recharging function will be realized. By these devices, an image display with tele-existence will be feasible by only a display with no need for additional camera to be disposed.

Although an example of application forms was simply shown here, various other application forms can be considered if the present invention is implemented. They are (1) a notebook type personal computer using an ultra thin, integrated structure panel of unified organic EL display/image scanner in which additional light source becomes not required because an organic EL device is used, and furthermore driving part is not necessary to provide, (2) a mobile terminal which is free of recharging, and capable of image read-in, (3) an electronic notice for circulation which is free of a battery or a wall socket and capable of writing, (4) an electronic bulletin board which can emit light under illumination without using a cable, (5) an information display board or an information read-in board which is capable of communicating by using a visible or infra-red light, (6) a full size light emission display which is capable of security check, (7) a light emission sign with sensing function both in daytime and at night, which is free of a battery because a thin film polymer battery or the like is combined, (8) a light emission advertising board which has both functions of light emission display and reading in the landscape, (9) a thin, optical mouse, and others.

In the following, an example of a basic device structure of the multifunction organic diode in accordance with the present invention is shown with a special emphasis put on a stacking layer structure of the organic part.

Figure 3:
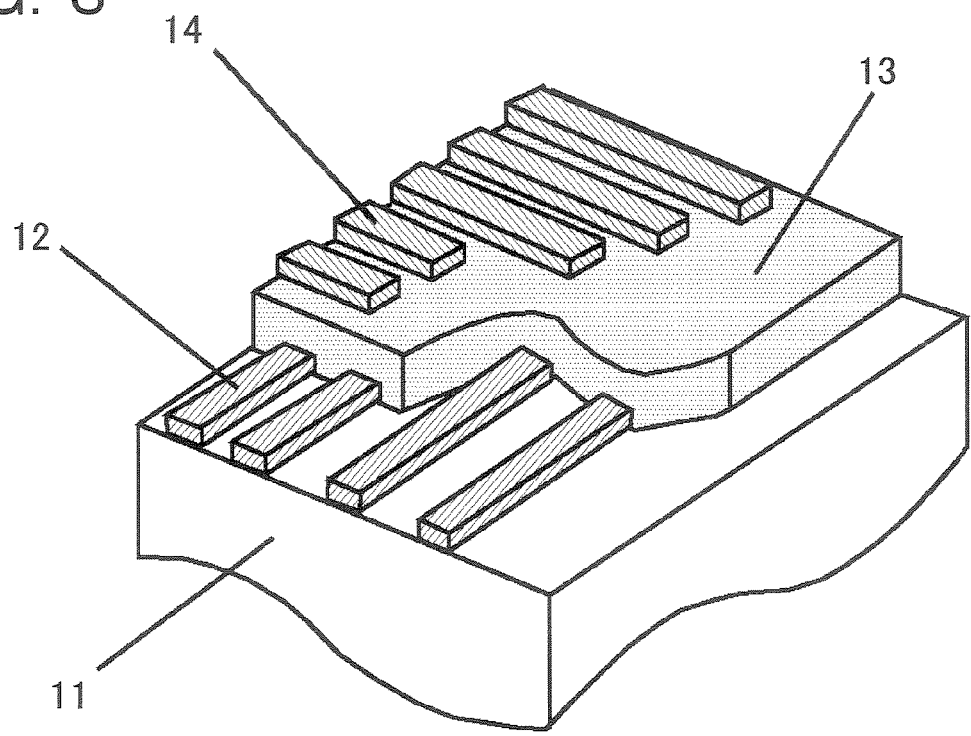
FIG. 3 shows an organic diode matrix of a single layer type with lower light emission and optical absorption part.
Figure 4:
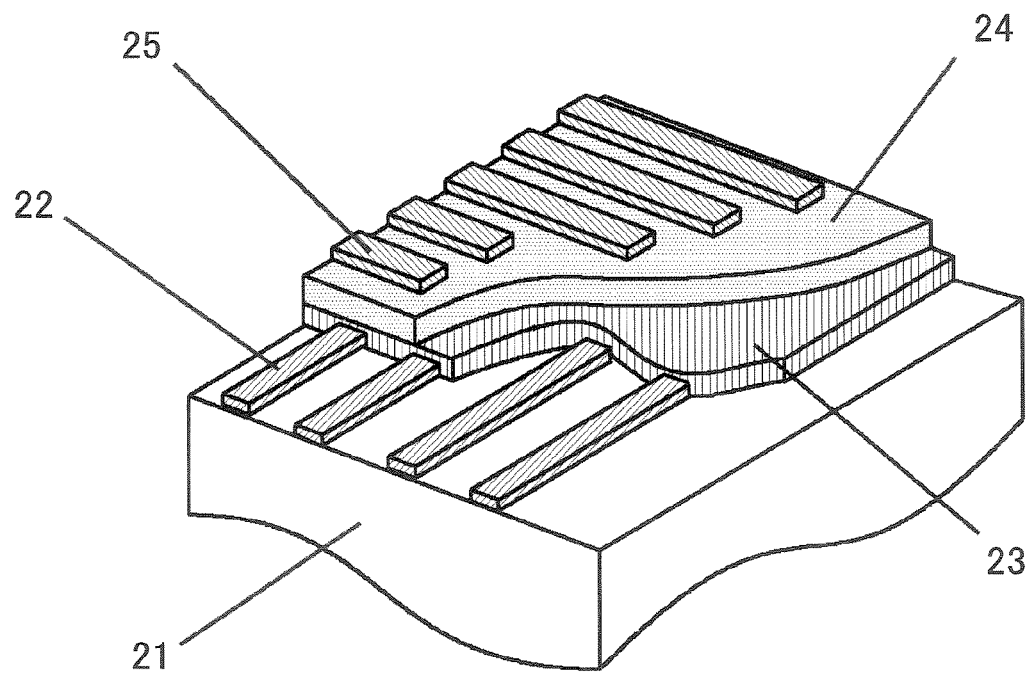
FIG. 4 shows an organic diode matrix of a double layer type with lower light emission and optical absorption part.
Figure 5:
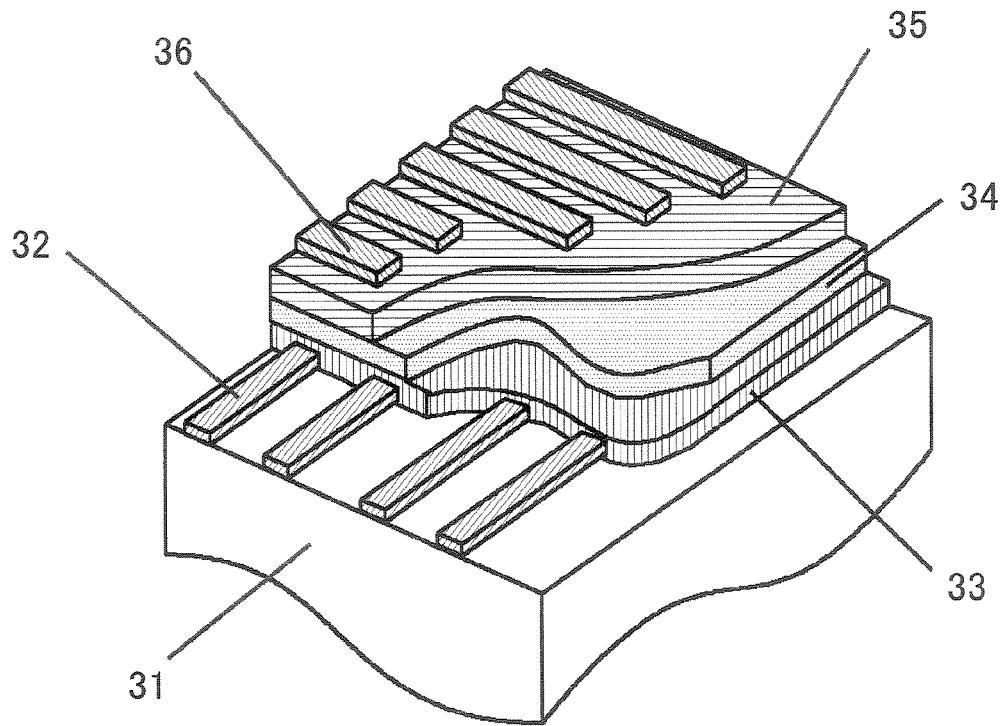
FIG. 5 shows an organic diode matrix of a triple layer type with lower light emission and optical absorption part.
Figure 6:
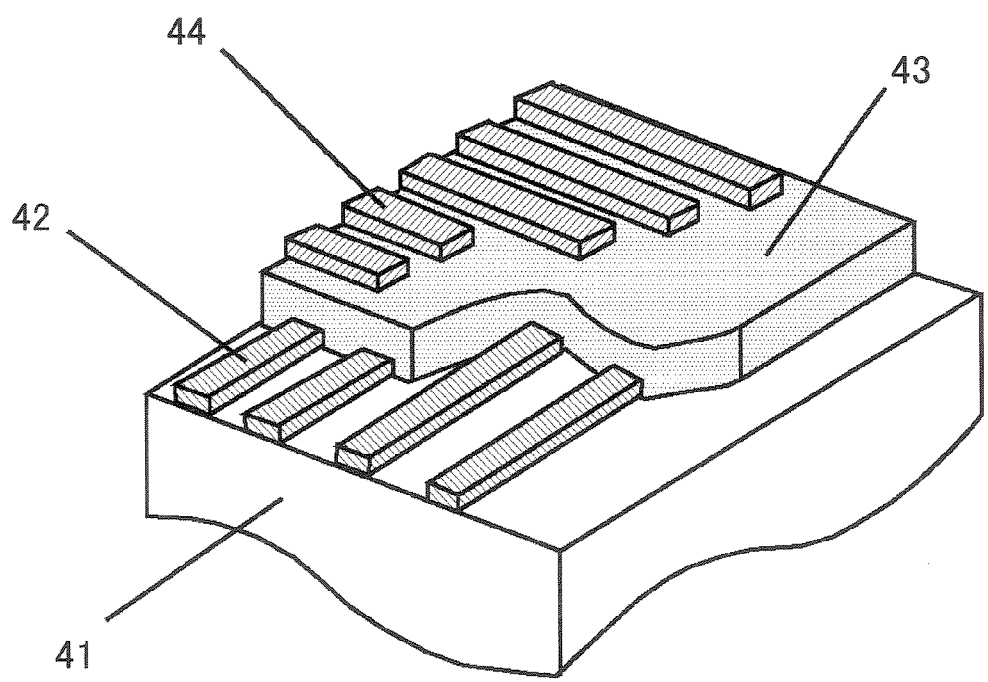
FIG. 6 shows an organic diode matrix of a single layer type with upper light emission and optical absorption part.
Figure 7:
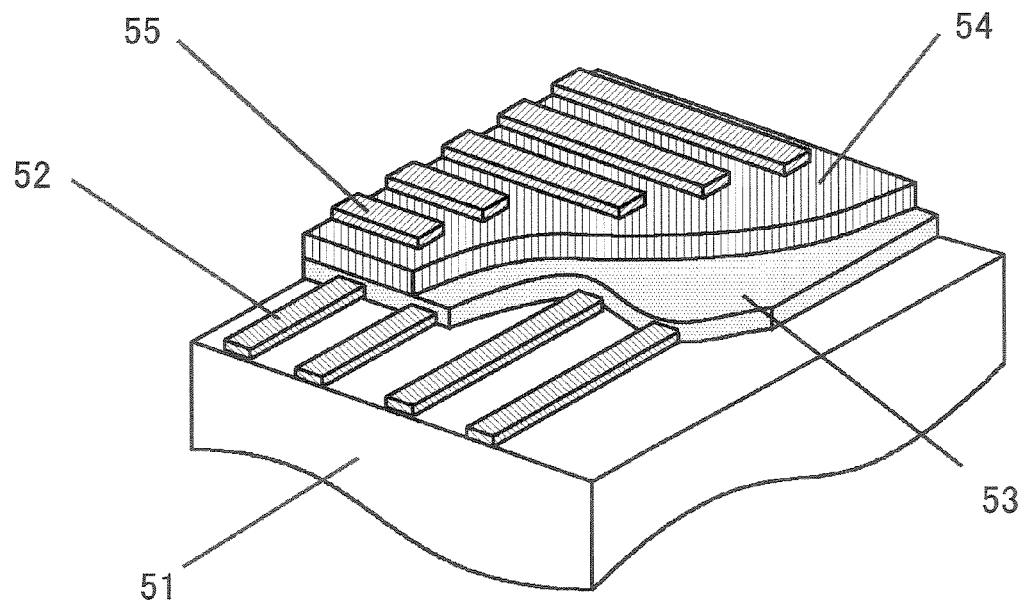
FIG. 7 shows an organic diode matrix of a double layer type with upper light emission and optical absorption part.
Figure 8:
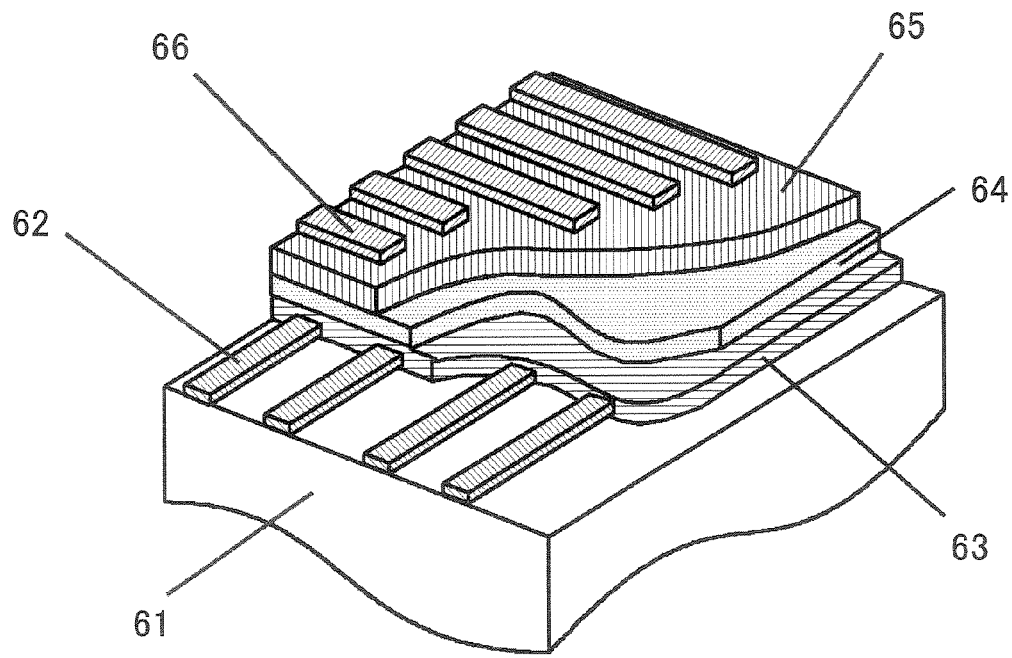
FIG. 8 shows an organic diode matrix of a triple layer type with upper light emission and optical absorption part.

FIG. 3 shows an organic diode matrix of a single layer type with lower light emission and optical absorption part. FIG. 4 shows an organic diode matrix of a double layer type with lower light emission and optical absorption part. FIG. 5 shows an organic diode matrix of a triple layer type with lower light emission and optical absorption part. FIG. 6 shows an organic diode matrix of a single layer type with upper light emission and optical absorption part. FIG. 7 shows an organic diode matrix of a double layer type with upper light emission and optical absorption part. FIG. 8 shows an organic diode matrix of a triple layer type with upper light emission and optical absorption part.

In FIG. 3, 11 is a substrate, 12 is a transparent anode (a first electrode) formed on the substrate 11, 13 is an organic thin film (organic layer) formed on the transparent anode 12 and having both of the properties of light emission and photoconductivity, and 14 is a second electrode (cathode) formed on the organic thin film 13, all of which constitutes an organic diode matrix of a single layer type with lower light emission and optical absorption (photoconductive) part.

In FIG. 4, 21 is a substrate, 22 is a transparent anode (a first electrode) formed on the substrate 21, 23 is a hole transport layer formed on the transparent anode 22, 24 is an organic thin film (organic layer) formed on the hole transport layer 23 and having both of the properties of light emission and photoconductivity, and 25 is a cathode (a second electrode) formed on the organic thin film 24, all of which constitutes an organic diode matrix of a double layer type with lower light emission and optical absorption (photoconductive) part.

In FIG. 5, 31 is a substrate, 32 is a transparent anode (a first electrode) formed on the substrate 31, 33 is a hole transport layer formed on the transparent anode 32, 34 is an organic thin film (organic layer) formed on the hole transport layer 33 and having both of the properties of light emission and photoconductivity, 35 is an electron transport layer formed on the organic thin film 34, and 36 is a cathode (a second electrode) formed on the electron transport layer 35, all of which constitutes an organic diode matrix of a triple layer type with lower light emission and optical absorption (photoconductive) part.

In FIG. 6, 41 is a substrate, 42 is a cathode (a first electrode) formed on the substrate 41, 43 is an organic thin film (organic layer) formed on the cathode 42 and having both of the properties of light emission and photoconductivity, and 44 is a transparent anode (a second electrode) formed on the organic thin film 43, all of which constitutes an organic diode matrix of a single layer type with upper light emission and optical absorption (photoconductive) part.

In FIG. 7, 51 is a substrate, 52 is a cathode (a first electrode) formed on the substrate 51, 53 is an organic thin film (organic layer) formed on the cathode 52 and having both of the properties of light emission and photoconductivity, 54 is a hole transport layer formed on the organic thin film 53, and 55 is a transparent anode (a second electrode) formed on the hole transport layer 54, all of which constitutes an organic diode matrix of a double layer type with upper light emission and optical absorption (photoconductive) part.

In FIG. 8, 61 is a substrate, 62 is a cathode (a first electrode) formed on the substrate 61, 63 is an electron transport layer formed on the cathode 62, 64 is an organic thin film (organic layer) formed on the electron transport layer 63 and having both of the properties of light emission and photoconductivity, 65 is a hole transport layer formed on the organic thin film 64, and 66 is a transparent anode (a second electrode) formed on the hole transport layer 65, all of which constitutes an organic diode matrix of a triple layer type with upper light emission and optical absorption (photoconductive) part.

An example of the basic device structure (a device structure realized on the basis of the claim 1) of the multifunction organic diode in accordance with the present invention was shown here. (1) It may be an example of the device structure wherein a first organic thin film (light emission part) having a light emission property and a second organic thin film (photodetector part) having a photoconductive property are sequentially stacked in place of an organic thin film. Furthermore, (2) It may be an example of the device structure wherein a first organic thin film (photodetector part) having a photoconductive property and a second organic thin film (light emission part) having a light emission property are sequentially stacked in place of an organic thin film.

When a stacked thin film (including stacked layers) is provided, various versions can be selected which include a structure of the stacked thin film (including stacked layers) comprising an electron transport layer or a hole transport layer on both sides or on one side thereof.

As for a material system, candidates for an organic material having both a light emission property and a photoconductive property are 4-[2-[5-[4-(Diethylamino)phenyl]-4,5-dihydro-1-phenyl-1H-pyrazol-3-yl]-ethenyl]-N,N-diethyl-aniline (PPR), and MEH-PPV, a candidate for an organic material having a photoconductive property is ditridecyl perylene-tetra-carboxylic diimide (td-PTC), N,N'-Bis(2,5-di-tert-butylphenyl-3,4,9,10-perylene-dicarboximide (BPPC), candidates for an organic material having a light emission property are fac tris(2-phenylpyridine)iridium (Ir(ppy)$_3$), quinacridone compound, coumarins, polyfluorene compound, 4-(di-cyano-methylene)-2-methyl-6-(p-dimethylaminostyril)-4H-pyran (DCM), a candidates for a host material are 4,4'-N,N-dicarbozole-biphenyl (CBP), 2,9-dimethyl-4,7-diphenyl-1,10-phenanthroline (BCP), Tris(8-hydroxyquinolinato) aluminum(III) (Alq$_3$), aluminum(III)bis(2-methyl-8-quinolinato)4-phenylphenolate (BAlq), and triazole compound, candidates for an electron transport material are silole compound, BCP, Alq$_3$, and BAlq, a candidate for a hole transport material is Bis[N-(1-naphthyl)-N-phenyl]benzidine (α-NPD), and a candidate for a hole transport material is triphenylamine compound.

The above materials are generally available material system, but as for organic materials, various materials are still under development, so that the present invention is not limited to the material system described above, but selecting and combining with various materials can be feasible.

Furthermore, the multifunction organic diode in accordance with the present invention is:

(1) the multifunction organic diode described in claim 1, characterized in that a difference between a wavelength of the maximum light emission and a wavelength of the maximum optical absorption of the organic thin film is larger than or equal to sum of the half width in wavelength at half maximum of the light emission and the half width in wavelength at half maximum of the optical absorption.

(2) the multifunction organic diode described in claim 3, characterized in that a difference between a wavelength of the maximum light emission of the first organic thin film and a wavelength of the maximum optical absorption of the second organic thin film is larger than or equal to sum of the half width in wavelength at half maximum of the light emission of the first organic thin film and the half width in wavelength at half maximum of the optical absorption of the second organic thin film.

(3) the multifunction organic diode described in claim 5, characterized in that a difference between a wavelength of the maximum optical absorption of the first organic thin film and a wavelength of the maximum light emission of the second organic thin film is larger than or equal to sum of the half width in wavelength at half maximum of the optical absorption of the first organic thin film and the half width in wavelength at half maximum of the light emission of the second organic thin film.

(4) the multifunction organic diode described in claim 7, characterized in that a difference between a wavelength of the maximum light emission and a wavelength of the maximum optical absorption of the organic thin film of a mixture of a first organic material and a second organic material is larger than or equal to sum of the half width in wavelength at half maximum of the light emission and the half width in wavelength at half maximum of the optical absorption.

Figure 9:
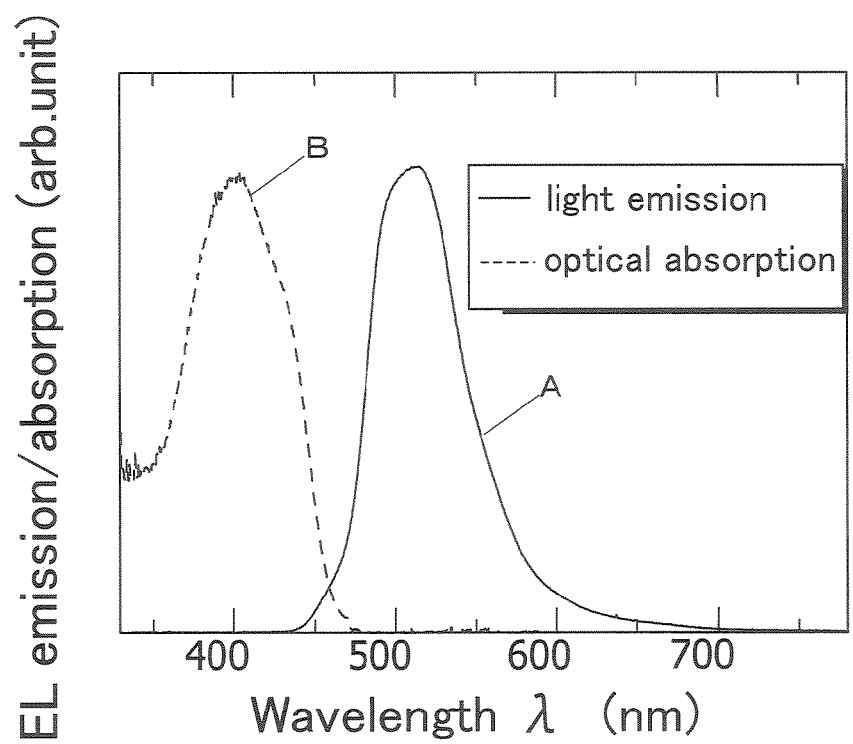
FIG. 9 shows light emission and optical absorption spectra for the multifunction organic diode with PPR as a material in accordance with the present invention.

In other words, the multifunction organic diode is characterized in that a ratio of optical absorption intensity to a light emission intensity is less than 50%, and a ratio of an optical absorption intensity in the organic thin film for an incident light intensity is 50% or more. That a ratio of an optical absorption intensity for an light emission intensity is less than 50% means that as shown in FIG. 9, a light emission spectrum A does not overlap with an optical absorption spectrum B. FIG. 9 is a light emission spectrum and an optical absorption spectrum for a material 4-[2-[5-[4-(Diethylamino)phenyl]-4,5-dihydro-1-phenyl-1H-pyrazol-3-yl]-ethenyl]-N,N-diethyl-aniline (PPR).

In this way, it is desirable that an optical absorption intensity for a light emission intensity over the whole spectrum range be less than 50%, and an optical absorption intensity for an incident light intensity over the whole spectrum range be 50% or more.

Furthermore, the multifunction organic diode is:
(1) the multifunction organic diode described in claim 1 or 2, characterized in that, with respect to optical absorption and a film thickness, the absorption coefficient of the organic thin film at the visible emitting light is less than $2.5 \times 10^4$ cm$^{-1}$ and the maximum absorption coefficient of the organic thin film for the absorptive light is greater than or equal to $2.5 \times 10^4$ cm$^{-1}$, and furthermore a film thickness of the organic thin film is less than or equal to 150 nm.
(2) the multifunction organic diode described in claim 1 or 2, characterized in that, with respect to optical absorption and a film thickness, the absorption coefficient of the organic thin film at the visible emitting light is less than $2.5 \times 10^4$ cm$^{-1}$ or the maximum absorption coefficient of the organic thin film for the absorptive light is greater than or equal to $2.5 \times 10^4$ cm$^{-1}$, and furthermore a film thickness of the organic thin film is less than or equal to 150 nm.
(3) the multifunction organic diode described in claim 3 or 4, characterized in that the absorption coefficient of the second organic thin film at the visible emitting light is less than $2.5 \times 10^4$ cm$^{-1}$ and the maximum absorption coefficient of the first organic thin film for the absorptive light is greater than or equal to $2.5 \times 10^4$ cm$^{-1}$, and furthermore the maximum absorption coefficient of the second organic thin film for the absorptive light is greater than or equal to $2.5 \times 10^4$ cm$^{-1}$ and a film thickness of the second organic thin film is less than or equal to 150 nm.
(4) the multifunction organic diode described in claim 3 or 4, characterized in that the absorption coefficient of the second organic thin film at the visible emitting light is less than $2.5 \times 10^4$ cm$^{-1}$ or the maximum absorption coefficient of the first organic thin film for the absorptive light is greater than or equal to $2.5 \times 10^4$ cm$^{-1}$, and a film thickness of the second organic thin film is less than or equal to 150 nm or the absorption coefficient of the second organic thin film for the visible emitting light is greater than or equal to $2.5 \times 10^4$ cm$^{-1}$ and a film thickness of the second organic thin film is less than or equal to 150 nm.
(5) the multifunction organic diode described in claim 5 or 6, characterized in that the absorption coefficient of the organic thin film at the visible emitting light is less than $2.5 \times 10^4$ cm$^{-1}$ and the maximum absorption coefficient of the organic thin film for the absorptive light is greater than or equal to $2.5 \times 10^4$ cm$^{-1}$, and furthermore a film thickness of the organic thin film is less than or equal to 150 nm.
(6) the multifunction organic diode described in claim 5 or 6, characterized in that the absorption coefficient of the organic thin film at the visible emitting light is less than $2.5 \times 10^4$ cm$^{-1}$ or the maximum absorption coefficient of the organic thin film for the absorptive light is greater than or equal to $2.5 \times 10^4$ cm$^{-1}$, and furthermore a film thickness of the organic thin film is less than or equal to 150 nm.
(7) the multifunction organic diode described in claim 7 or 8, characterized in that the absorption coefficient of the organic thin film at the visible emitting light is less than $2.5 \times 10^4$ cm$^{-1}$ and the maximum absorption coefficient of the organic thin film for the absorptive light is greater than or equal to $2.5 \times 10^4$ cm$^{-1}$, and furthermore a film thickness of the organic thin film is less than or equal to 150 nm.
(8) the multifunction organic diode described in claim 7 or 8, characterized in that the absorption coefficient of the organic thin film at the visible emitting light is less than $2.5 \times 10^4$ cm$^{-1}$ or the maximum absorption coefficient of the organic thin film for the absorptive light is greater than or equal to $2.5 \times 10^4$ cm$^{-1}$, and furthermore a film thickness of the organic thin film is less than or equal to 150 nm.

Furthermore, the multifunction organic diode is:
(1) the multifunction organic diode described in claim 17, characterized in that an organic thin film which is a mixture of the organic material of the organic thin film described above and the organic thin film of the hole transport layer having a property of hole transport is used for the entirety or a part of the organic thin film.
(2) the multifunction organic diode described in claim 18, characterized in that an organic thin film which is a mixture of the organic material of the organic thin film described above and the organic thin film of the electron transport layer having a property of electron transport is used for the entirety or a part of the organic thin film.

Figure 10:
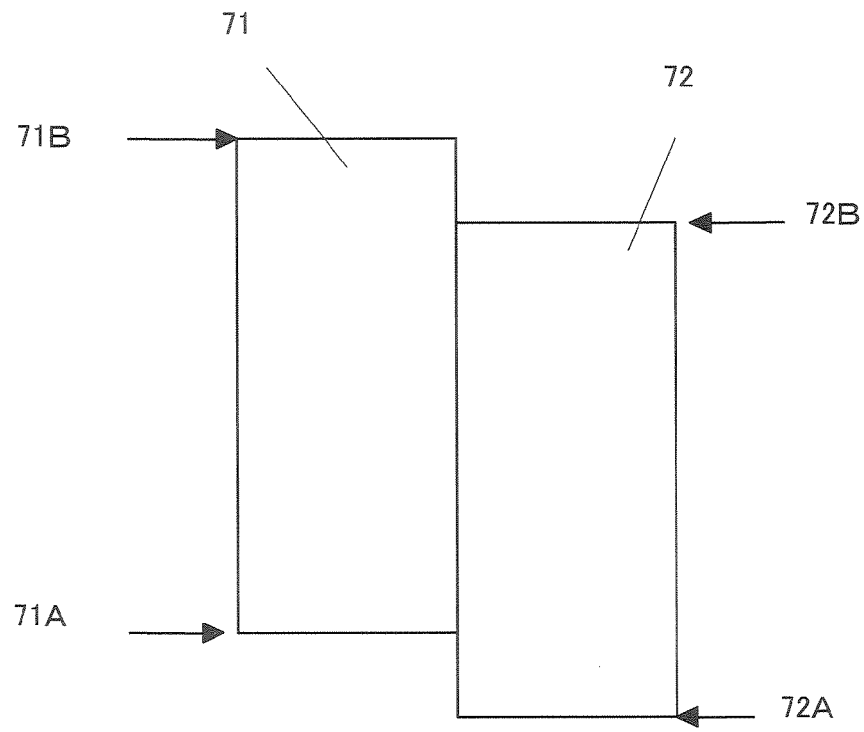
FIG. 10 shows a schematic band diagram of a film with a property of hole transport and an organic thin film in accordance with the present invention.
Figure 11:
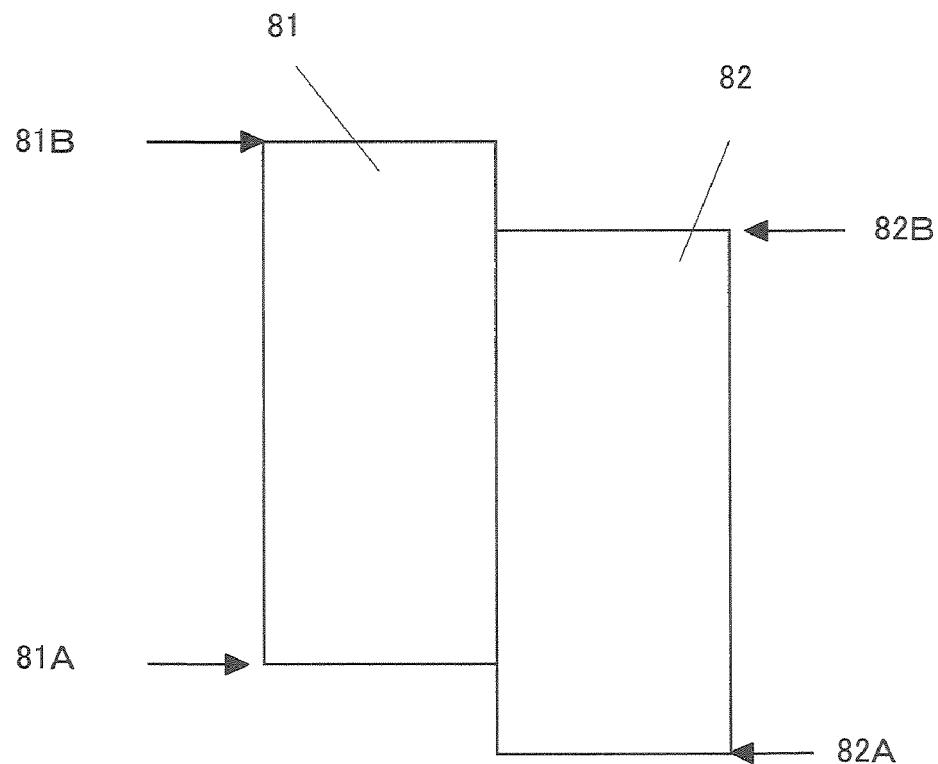
FIG. 11 shows a schematic band diagram of a film with a property of electron transport and an organic thin film in accordance with the present invention.

Furthermore, as shown in FIG. 10, an upper and lower relation of energy means that the highest occupied molecular orbital 71A of the film 71 having a hole transport property lies above (is lower in energy than) the highest occupied molecular orbital 72A of the organic thin film 72. In addition, as shown in FIG. 11, it is meant that the highest occupied molecular orbital 81A of the organic thin film 81 lies above (is lower in energy than) the highest occupied molecular orbital 82A of the film 82 having an electron transport property. Additionally, 71B, 72B, 81B, 82B in these figures indicate the lowest unoccupied molecular orbitals of the respective films.

Furthermore, among films having a hole transport property there is a film to improve flatness, thereby acting as a film with an effect as a buffer layer. For example, PEDOT (3,4-ethylenedioxythiophene)/poly(styrenesulfonate) and the like which is a type to apply a solution is suitable to improve flatness and to improve reliability.

Figure 12:
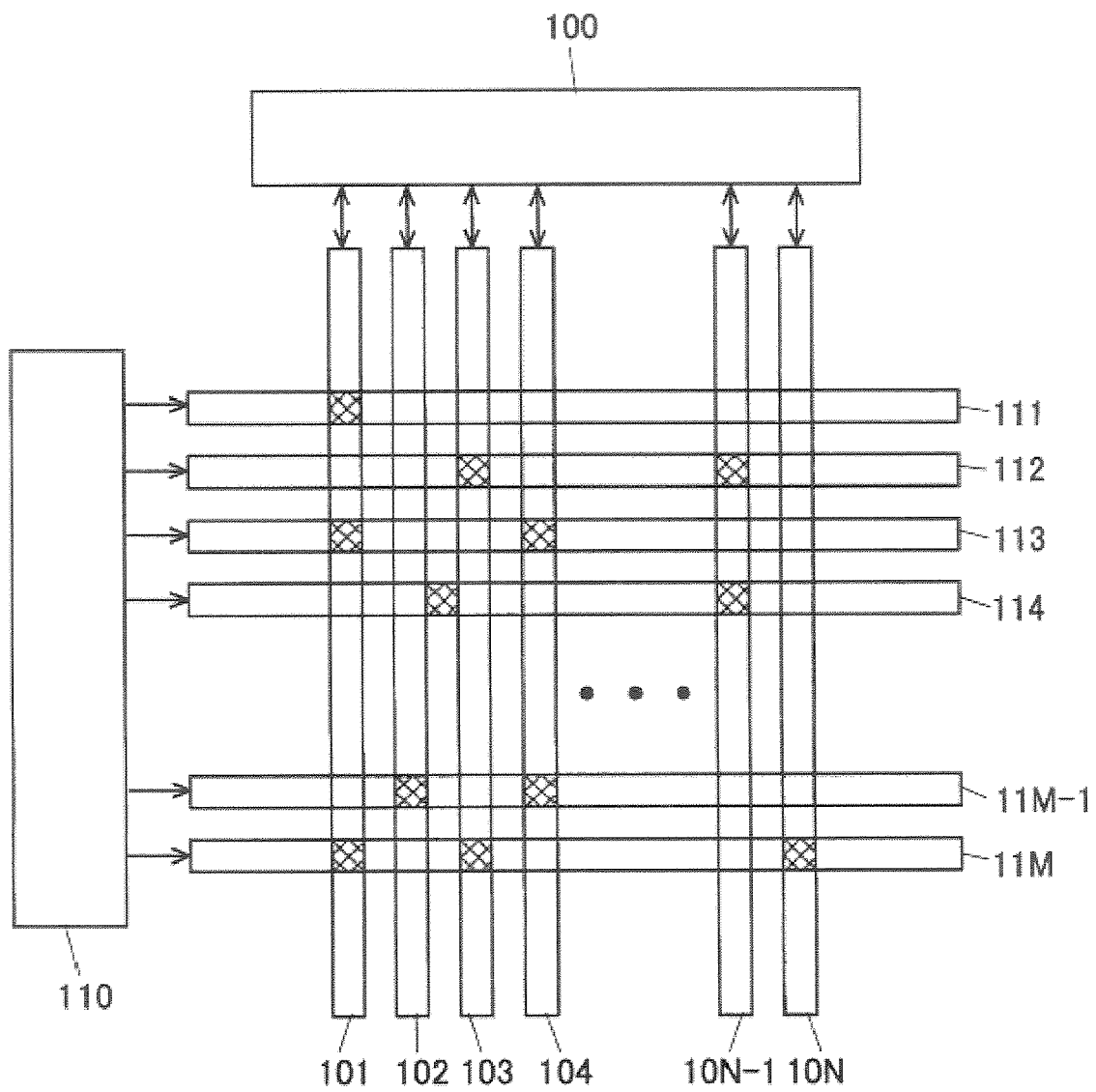
FIG. 12 shows a configuration of a multifunction organic diode matrix in accordance with the present invention.

FIG. 12 shows a matrix configuration using the multifunction organic diode described above.

In this figure, 100 is an anode driving circuit, 101, 102, 103, 104, 10N-1, 10N are matrix anodes connected to the anode driving circuit 100, 110 is a cathode driving circuit, 111, 112, 113, 114, - - -, 11M-1, 11M are matrix cathodes connected to the cathode driving circuit 110. As an example of driving, in a case of light emission, each column (matrix anode) is sequentially selected, and each row (matrix cathode) is given a voltage or a current corresponding to image information, thereby performing a light emission. Furthermore, in a case of photodetection, each column (matrix anode) is sequentially selected, and from each row (matrix cathode) a current corresponding to image information is change over/detected by the driving circuit, thereby enabling photodetection. For more detailed examples, there is a description in the Non-Patent Document 5 above by Matsui et al.

Also a configuration of a picture element in the active type circuit configuration is described here.

Figure 13:
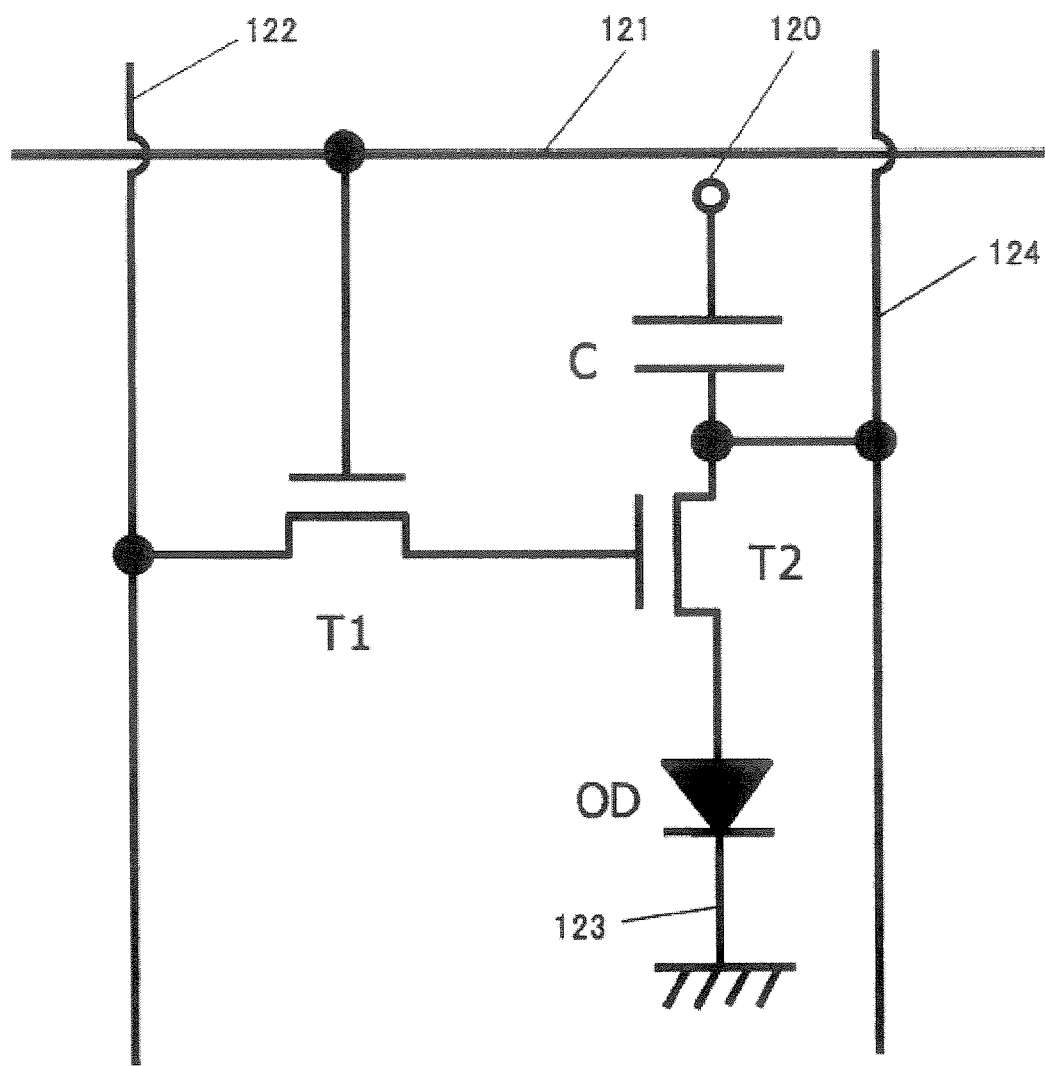
FIG. 13 shows an active type circuit configuration of a light emission and optical absorption organic diode with two transistor driving system in accordance with the present invention.
Figure 14:
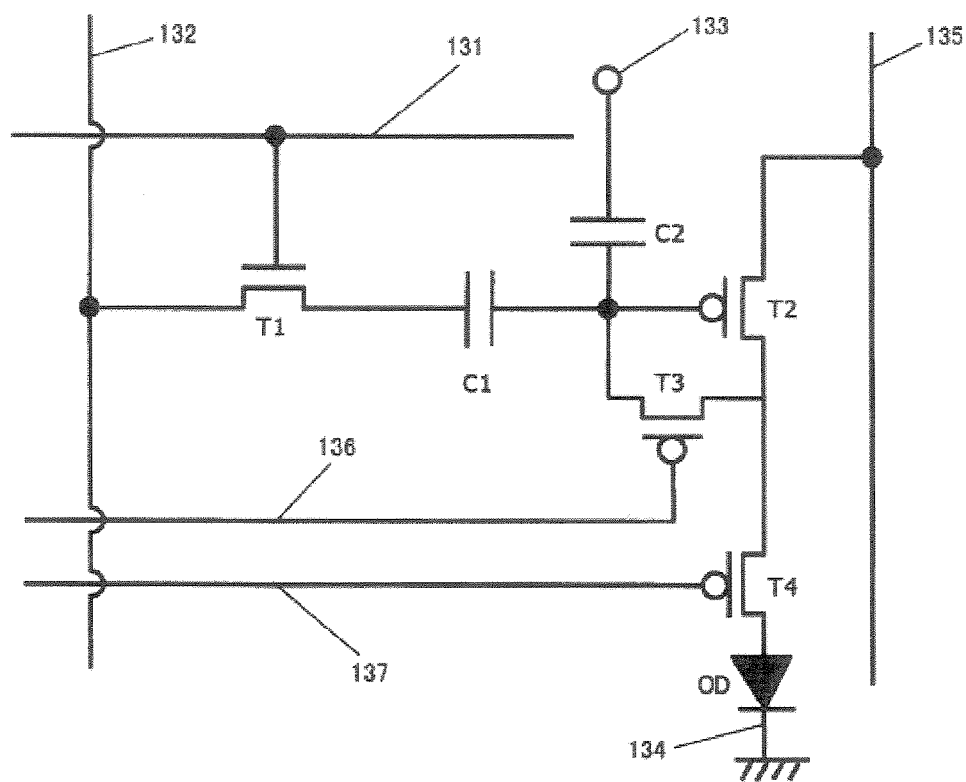
FIG. 14 shows an organic active type circuit configuration of a light emission and optical absorption organic diode with a voltage program system in accordance with the present invention.
Figure 15:
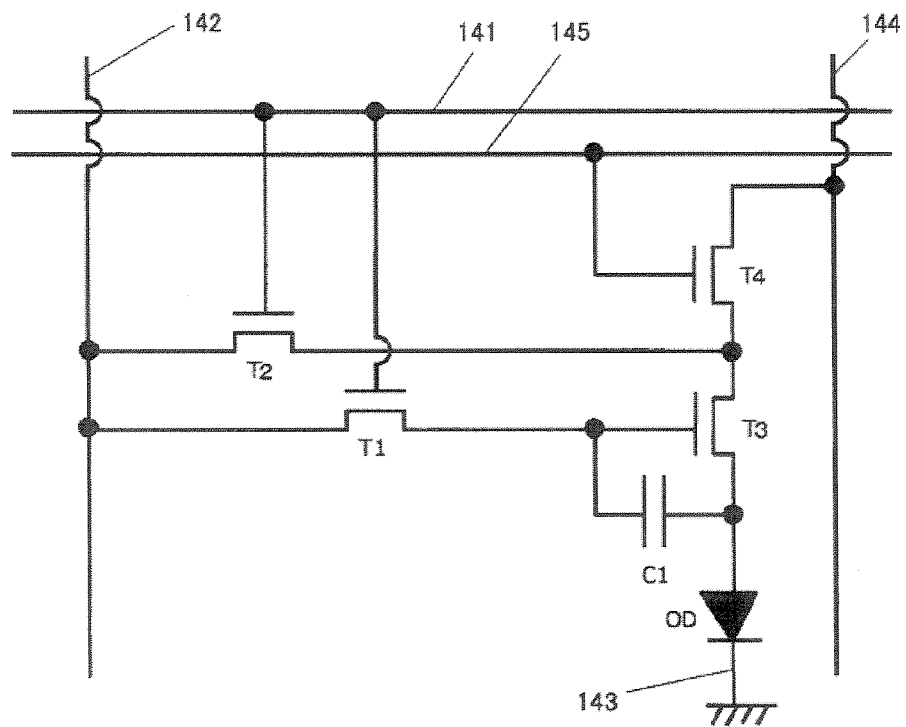
FIG. 15 shows an active type circuit configuration of a light emission and optical absorption organic diode with a current program system in accordance with the present invention.
Figure 16:
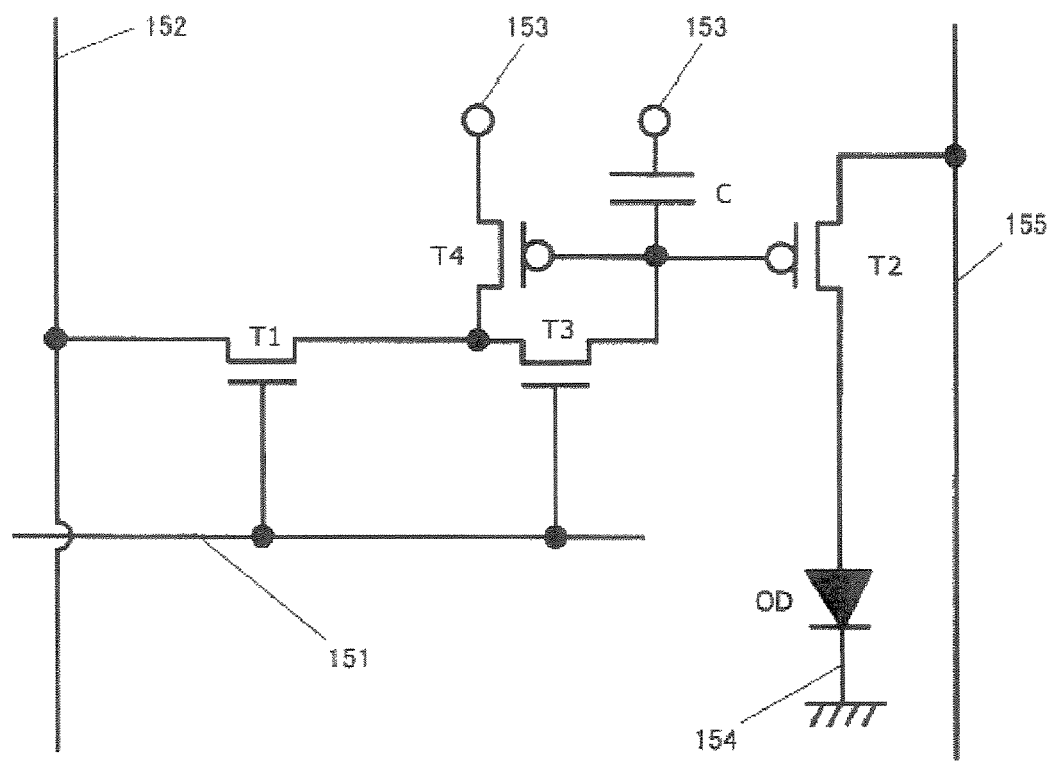
FIG. 16 shows an active type circuit configuration of a light emission and optical absorption organic diode with a current mirror type in accordance with the present invention.

FIG. 13 shows an example of an active type circuit configuration of a light emission and optical absorption organic diode with two transistor driving system. FIG. 14 shows an example of an organic active type circuit configuration of a light emission and optical absorption organic diode with a voltage program system. FIG. 15 shows an example of an active type circuit configuration of a light emission and optical absorption organic diode with a current program system. FIG. 16 shows an example of an active type circuit configuration of a light emission and optical absorption organic diode with a current mirror type. In FIG. 13, a series connection of a capacitor C, a second transistor T2, an organic diode OD and a cathode line 123 to be grounded is connected to a voltage line 120. A complex line 124 for a power supply and a signal output is connected at an intermediate point between the capacitor C and the second transistor T2. A first transistor T1 is connected to a data line 122, and also connected to a gate electrode of the second transistor T2. A select line 121 is connected to a gate electrode of the first transistor T1. All of them constitute the active type circuit of a light emission and optical absorption organic diode with two transistor driving system.

Here, by using an organic diode structure having both a light emission property and a photoconductive property, the organic diode OD under forward bias is made to emit light by changing the gate voltage of the second transistor T2 by applying an analog signal voltage to the gate electrode of the first transistor T1 during a period in which a selection signal is given. From the organic diode OD under reverse bias a current in proportion to the incident amount of light irradiation is made to flow by changing the gate voltage of the second transistor T2 by applying an analog signal voltage to the gate electrode of the first transistor T1 during a period in which a selection signal is given, thereby detecting the current signal through the second transistor T2 and an outer peripheral circuit.

In FIG. 14, a second storage capacitor C2, a third transistor T3, a fourth transistor T4, an organic diode OD and a cathode line 134 to be grounded are connected in series on the voltage line 133. A first transistor T1 is connected to a data line 132 and also connected to a first storage capacitor C1. The first storage capacitor C1 is connected to an intermediate point between the second storage capacitor C2 and the third transistor T3, and furthermore connected to a gate electrode of a second transistor T2. A select line 131 is connected to the first transistor T1. A first timing signal line 136 is connected to the gate electrode of the third transistor T3, and a second timing signal line 137 is connected to the gate electrode of the fourth transistor T4. A complex line 135 for a power supply and a signal output is connected to a series connection of the second transistor T2, the fourth transistor T4, the organic diode OD and the cathode line 134 to be grounded. All of them constitute an organic active type circuit of a light emission and optical absorption organic diode with a voltage program system.

Here, by using an organic diode structure having both a light emission property and a photoconductive property, and during a first selected period, the third transistor T3 is made conductive, the second transistor T2 is made as a diode with the threshold voltage of the second transistor T2 being written into the gate part of the second transistor T2 while holding the voltage by the second storage capacitor C2. By applying an analog signal voltage to the gate electrode of the first transistor T1 during a period in which a selection signal is given, a signal voltage is superimposed to the gate voltage of the second transistor T2 through the capacitive coupling of the first capacitor C1, and the fourth transistor T4 is selected, thereby emitting light from the organic diode OD under forward bias. During another selected period, the third transistor T3 is made conductive, the second transistor T2 is made as a diode with the threshold voltage of the second transistor T2 being written into the gate part of the second transistor T2 while holding the gate voltage by the second storage capacitor C2. By applying an analog signal voltage to the gate electrode of the first transistor T1 during a period in which a selection signal is given, a signal voltage is superimposed through the capacitive coupling of the first capacitor C1 to the gate voltage of the second transistor T2, thereby making the second transistor conductive (on). Then the fourth transistor T4 is selected, thereby a current in proportion to the incident amount of light irradiation is made to flow from the organic diode OD under reverse bias through the second and the fourth transistors T2 and T4, thereby enabling signal detection through an outer peripheral circuit.

In FIG. 15, a series connection of a fourth transistor T4, a third transistor T3, an organic diode OD and the cathode line 143 to be grounded is connected to a complex line 144 for a power supply and a signal output. A second transistor T2 is connected to a data line 142 and also connected to an intermediate point between the fourth transistor T4 and the third transistor T3. Also a first transistor T1 is connected to the data line 142 and to a gate electrode of the third transistor T3 and to a storage capacitor C1. The storage capacitor C1 is connected to an intermediate point between the third transistor T3 and the organic diode OD. A first select line 141 is connected to the gate electrode of the second transistor T2 and to the gate electrode of the first transistor T1. A second select line 145 is connected to the gate electrode of the fourth transistor T4. All of them constitute an active type circuit of a light emission and optical absorption organic diode with a current program system.

Here, by using an organic diode structure having both a light emission property and a photoconductive property, and during a first selected period, the first and a second transistors T1 and T2 are made conductive (on), and a voltage corresponding to the flowing analog current intensity is written into the gate electrode of the third transistor T3 and to the first storage capacitor C1. During a second period, and a current is made to flow through the third transistor T3 biased in advance by making the fourth transistor T4 conductive (on), thereby the organic diode OD under forward bias is made to emit light. During another selected period, the first and a second transistors T1 and T2 are made conductive (on), a voltage corresponding to the flowing analog current intensity is written into the gate electrode of the third transistor T3 and into the first storage capacitor C1, and the fourth transistor T4 is selected, thereby a current in proportion to the incident amount of light irradiation is made to flow from the organic diode OD under reverse bias through the third and the fourth transistors T3 and T4, thereby enabling signal detection through an outer peripheral circuit.

In FIG. 16, a series connection of a second transistor T2, an organic diode OD and the cathode line 154 to be grounded is connected to a complex line 155 for a power supply and a signal output. A data line 152 is connected in series with a first transistor T1 and a third transistor T3. A select line 151 is connected to the gate electrode of the first transistor T1 and to the gate electrode of the third transistor T3. A storage capacitor C which is connected to a power supply line 153 is connected to the third transistor T3. A fourth transistor T4 is connected to the power supply line 153 and also connected to an intermediate point between the first transistor T1 and the third transistor T3. The storage capacitor C is also connected to the gate electrode of the fourth transistor T4 and to the gate electrode of the second transistor T2. All of them constitute an active type circuit of a light emission and optical absorption organic diode with a current mirror type.

Here, by using an organic diode structure having both a light emission property and a photoconductive property, and during a period in which the first and the third transistors T1 and T3 are made conductive (on), a current data is written into the storage capacitor C through the data line 152 using a pinch-off state of the fourth transistor T4. During a second period, by making the first transistor T1 and the third transistor T3 non-conductive (off), and by letting a current flow through the second transistor T2 biased in advance, thereby emitting light from the organic diode OD under forward bias. During another selected period in which the first and the third transistors T1 and T3 are made conductive (on), a current is made to flow through the storage capacitor c through the data line 152 using the pinch-off state of the fourth transistor T4, thereby the second and the fourth transistors T2 and T4 are made conductive (on). The first transistor T1 and the third transistor T3 are made non-conductive (off), and a current is made to flow through the second transistor T2 biased in advance, thereby enabling to detect a current from the organic diode OD biased in the reverse direction.

Furthermore, the basic configuration is able to be realized with the similar circuit configuration as for the active type organic EL device, but a principal difference lies in the complex line for a power supply and a signal output. In the organic EL device, the complex line for a power supply and a signal output is simply to be a role of a power supplying line, which is common configuration over a panel. The complex line for a power supply and a signal output in accordance with the present invention, however, applies a voltage common to an entirety of the panel to supply a voltage of the power source in the case of driving an organic EL device, and the complex line for a power supply and a signal output is used to detect a current signal from the organic diode corresponding to each column selectively through the driving circuit in the case of photodetection. Thus the complex device in accordance with the present invention can be produced without significant change in process from the process of fabrication of the conventional organic EL device.

In the following, implemented examples of the device property realized in accordance with the present invention are described. As for material having a light emission property as well as a photoconductive property, a pyrazoline derivative PPR was used here. A substrate sputtered by Indium Zinc Oxide (IZO) was used for a cathode material. CuPc, poly(3,4-ethylenedioxythiophene)/poly(styrenesulfonate) (PEDOT, H. C.Starck), and $MoO_3$ are used as a buffer layer having hole transport property. BCP and BAlq were used as an electron injection/hole blocking layer. LiF/Al was used as an insulator/cathode for electron injection. Furthermore, all layers including an organic material, buffer layer and the like were formed by a resistive heating evaporation method. A light source was a Xe lamp with 33 mW/cm Stacked layer structures of devices studied here are as follows.

IZO/CuPc (30 nm)/PPR (50 nm)/BCP (20 nm)/Al (device structure 1)
IZO/PPR (40 nm)/BCP (20 nm)/Al (device structure 2)
IZO/CuPc (30 nm)/PPR (50 nm)/BCP (20 nm)/LiF (1 nm)/Al (device structure 3)
IZO/$MoO_3$ (30 nm)/PPR (50 nm)/BCP (20 nm)/LiF (1 nm)/Al (device structure 4)
IZO/CuPc (30 nm)/PPR (50 nm)/BAlq (20 nm)/LiF (1 nm)/Al (device structure 5)
IZO/PEDOT (2-30 nm)/PPR (50 nm)/BCP (20 nm)/LiF (1 nm)/Al (device structure 6)

Absorbance as a function of wavelength in a liquid solution ($10^{-4}$ wt %, chloroform solution) for the PPR under study and the $Alq_3$ which is representative material for an organic EL device is shown in FIG. 17(a). Photoluminescence intensity in a liquid solution ($10^{-3}$ wt %, chloroform solution) of the PPR and the $Alq_3$ is shown in FIG. 17(b). For comparison, the maximum absorption coefficient in a thin film was $4.6 \times 10^4$ $cm^{-1}$ (385-405 nm) for the PPR, and $2.2 \times 10^4$ $cm^{-1}$ (390 nm) for the $Alq_3$. As shown in FIG. 17(a), the maximum absorption wavelength and full width at half maximum in wavelength of absorbance were 402 nm, and 66 nm, respectively for the PPR, and 387 nm and 72 nm for the $Alq_3$, respectively. Clearly from this, the maximum absorbance for the PPR was larger by a factor of about 7 than that for the $Alq_3$, thereby demonstrating suitability of the PPR to visible light absorption. As for photoluminescence, a wavelength of the maximum luminescence intensity and a full width in wavelength at half maximum of the luminescence were 514 nm and 72 nm, respectively, for the PPR, while they were 518 nm and 92 nm for the $Alq_3$. A difference between a wavelength of the maximum absorption intensity and a wavelength of the maximum luminescence intensity is 112 nm for the PPR and 92 nm for the $Alq_3$. When this difference in wavelength is larger than a sum of the half width in wavelength at half maximum of the absorption intensity and the half width in wavelength at half maximum of the luminescence, the luminescence is not absorbed.

FIGS. 18 to 35 show characteristics for the device structure 1 to 6 described above.

Figure 18:
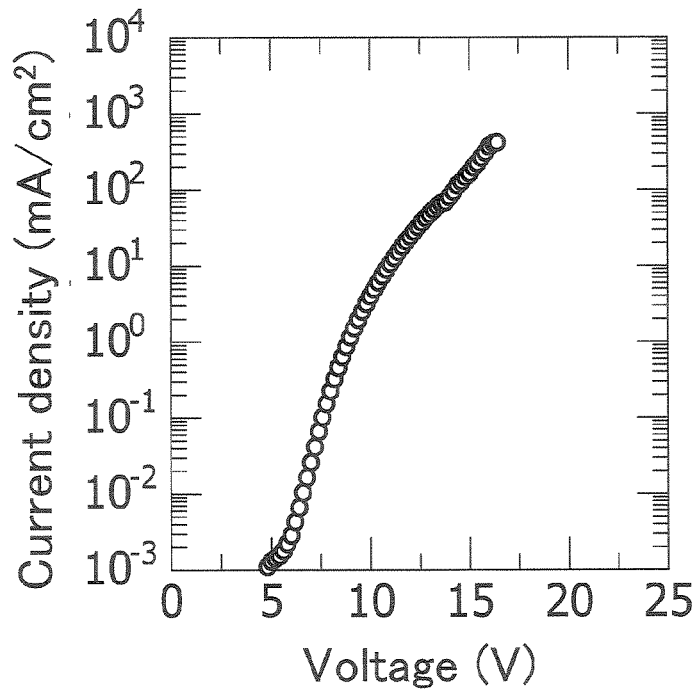
FIG. 18 shows a current density versus voltage characteristic of an organic diode device structure 1 in accordance with the present invention.
Figure 19:
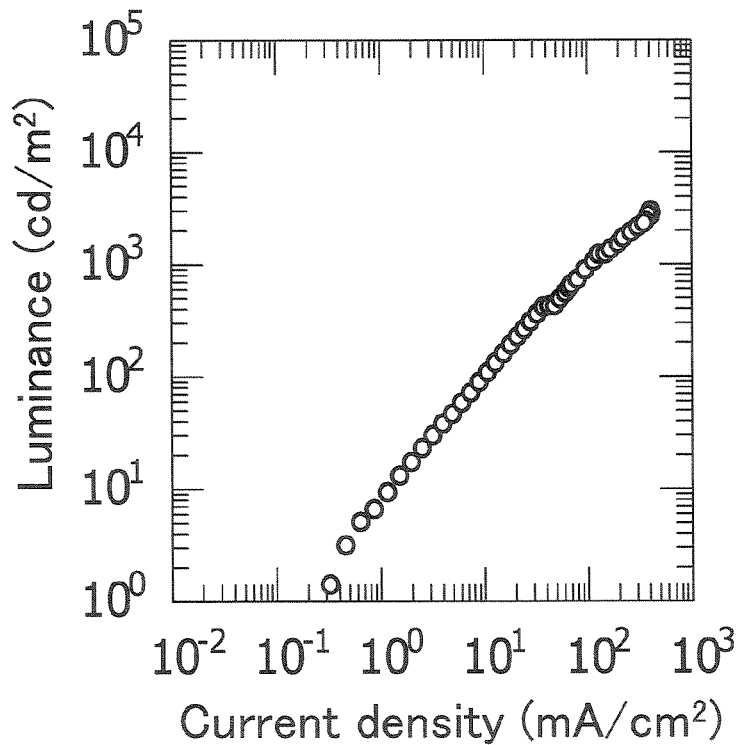
FIG. 19 shows a luminance versus current density characteristic of an organic diode device structure 1 in accordance with the present invention.
Figure 20:
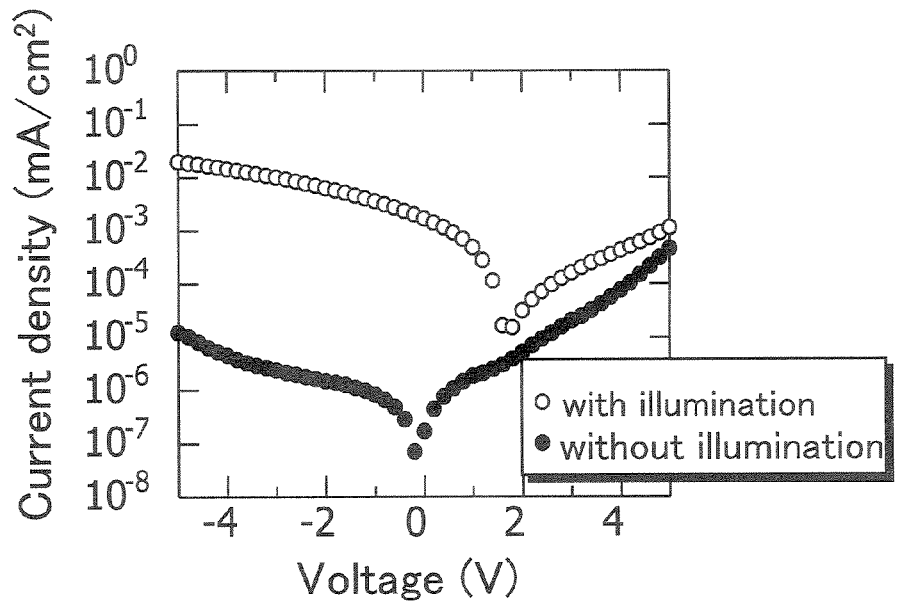
FIG. 20 shows a change of a photodiode characteristic due to illumination of light of an organic diode device structure 1 in accordance with the present invention.
Figure 21:
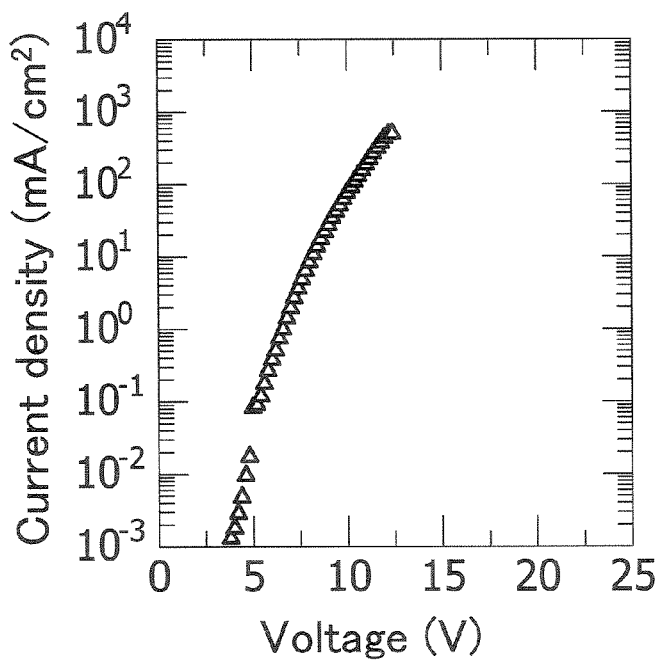
FIG. 21 shows a current density versus voltage characteristic of an organic diode device structure 2 in accordance with the present invention.
Figure 22:
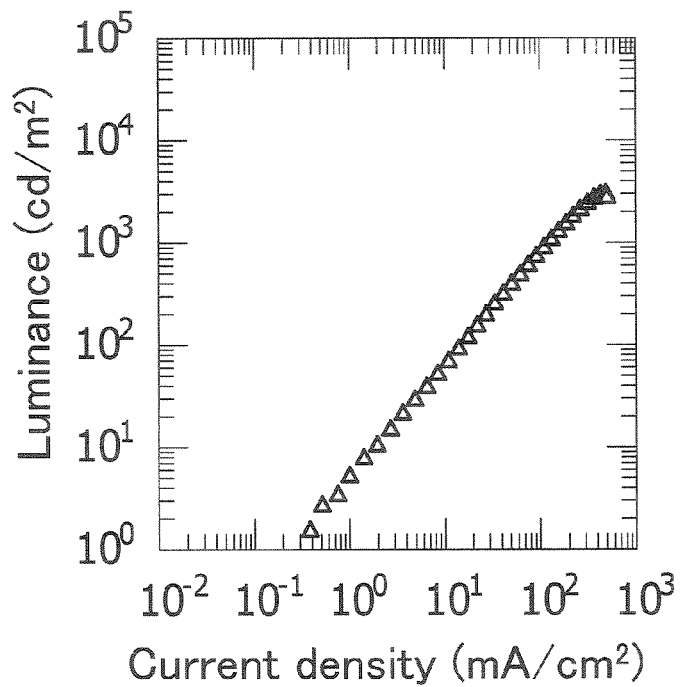
FIG. 22 shows a luminance versus current density characteristic of an organic diode device structure 2 in accordance with the present invention.
Figure 23:
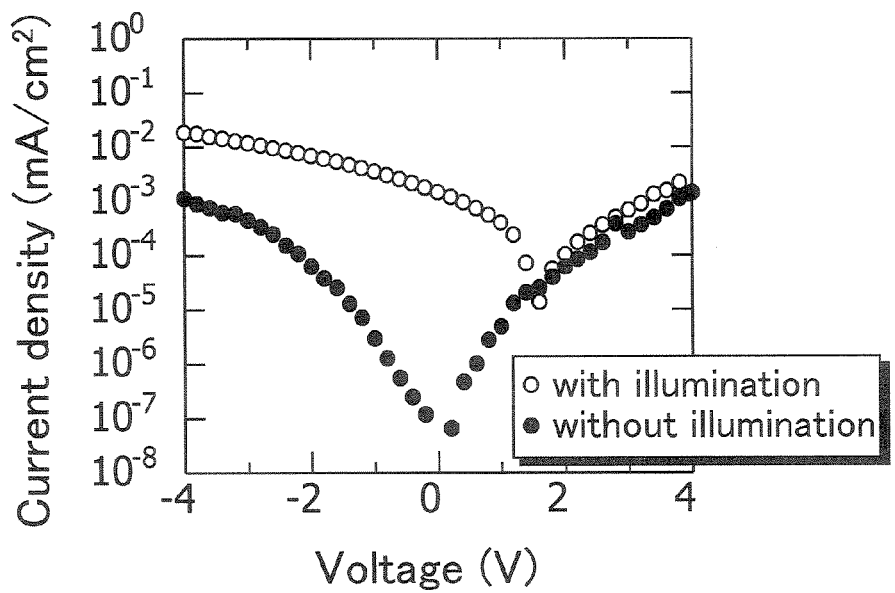
FIG. 23 shows a change of a photodiode characteristic due to illumination of light of an organic diode device structure 2 in accordance with the present invention.
Figure 24:
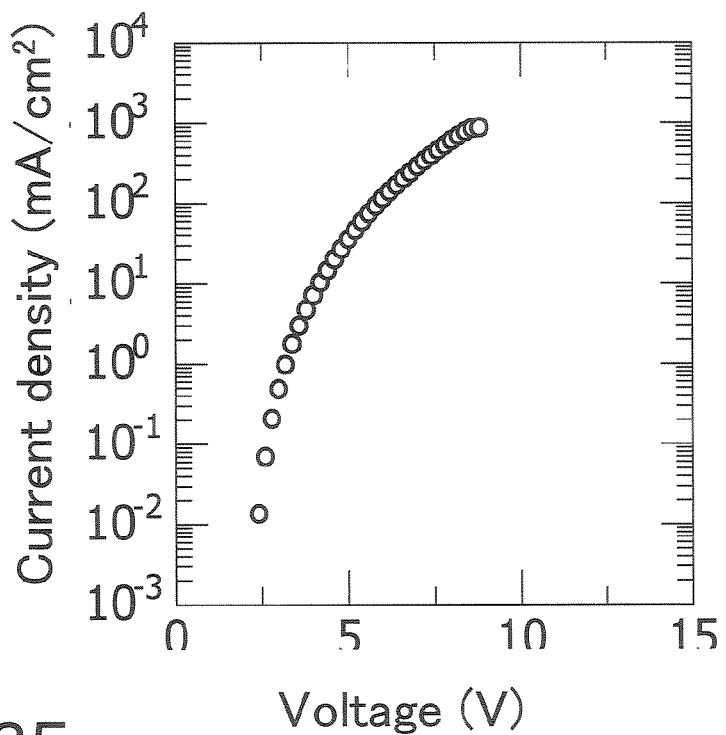
FIG. 24 shows a current density versus voltage characteristic of an organic diode device structure 3 in accordance with the present invention.
Figure 25:
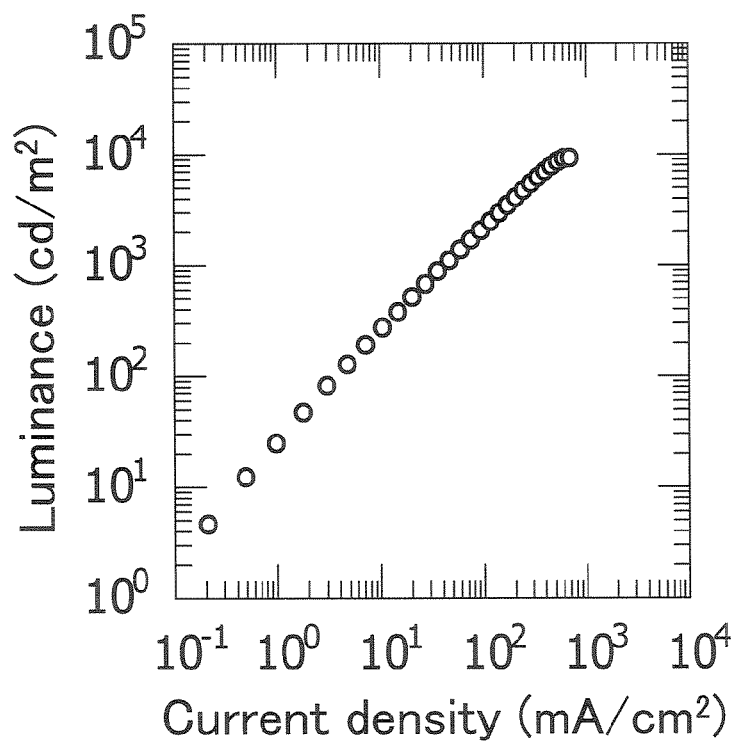
FIG. 25 shows a luminance versus current density characteristic of an organic diode device structure 3 in accordance with the present invention.
Figure 26:
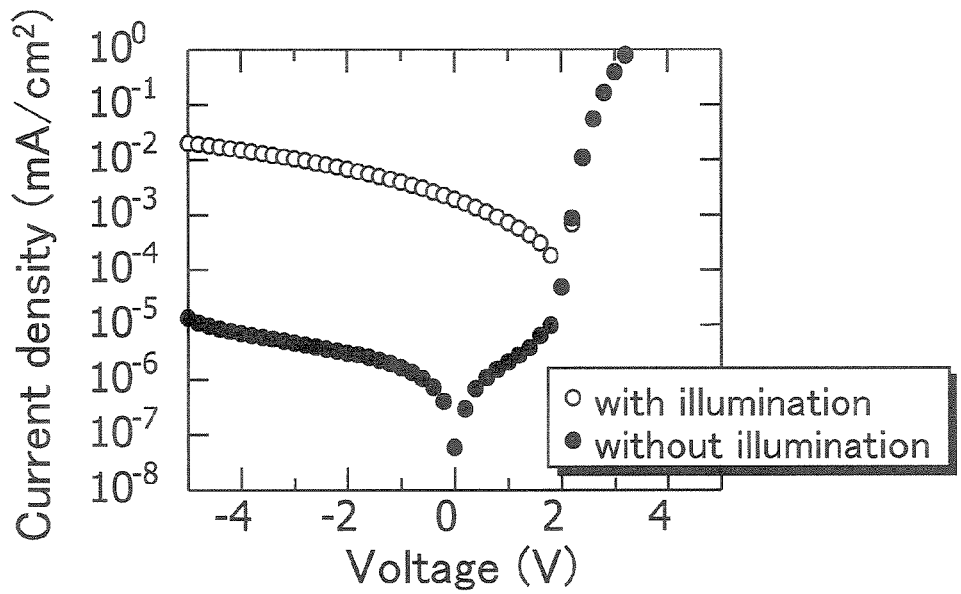
FIG. 26 shows a change of a photodiode characteristic due to illumination of light of an organic diode device structure 3 in accordance with the present invention.
Figure 27:
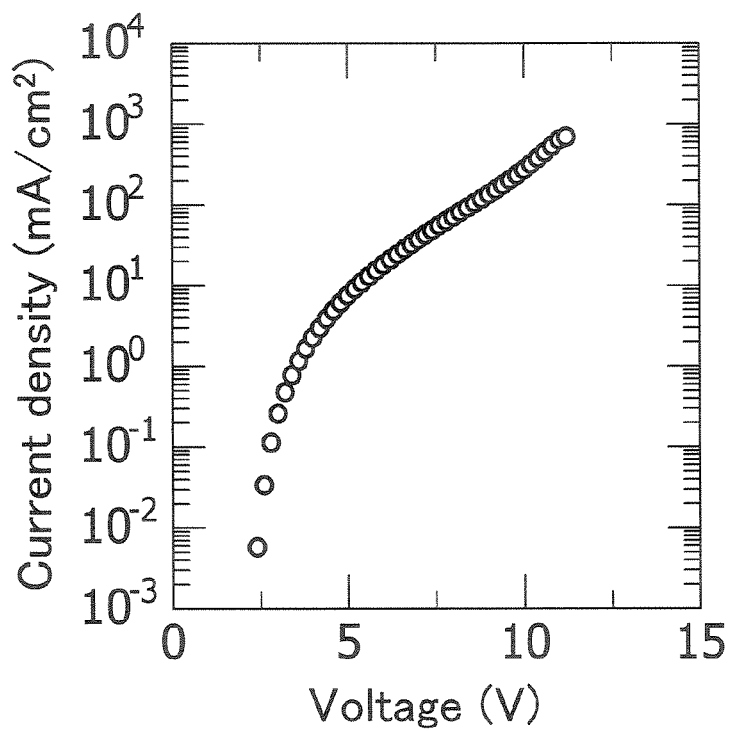
FIG. 27 shows a current density versus voltage characteristic of an organic diode device structure 4 in accordance with the present invention.
Figure 28:
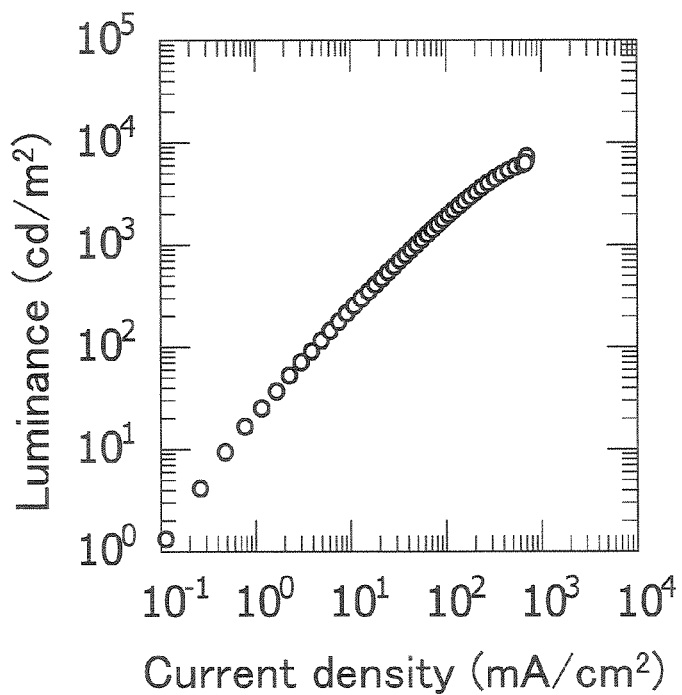
FIG. 28 shows a luminance versus current density characteristic of an organic diode device structure 4 in accordance with the present invention.
Figure 29:
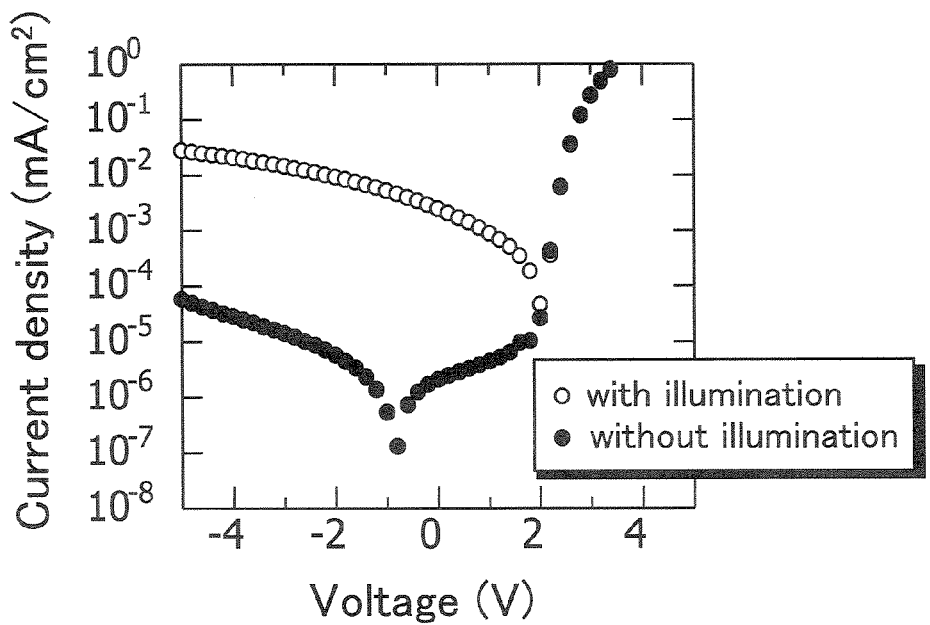
FIG. 29 shows a change of a photodiode characteristic due to illumination of light of an organic diode device structure 4 in accordance with the present invention.
Figure 30:
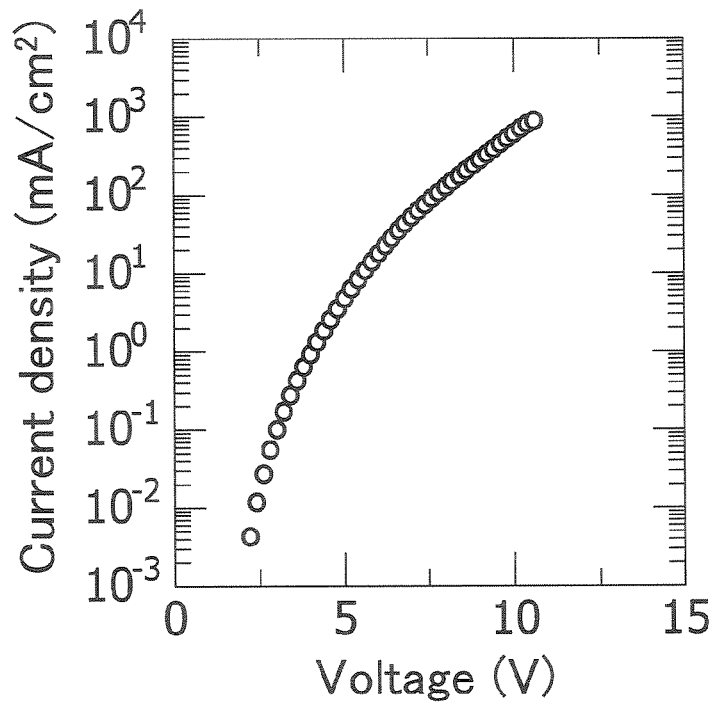
FIG. 30 shows a current density versus voltage characteristic of an organic diode device structure 5 in accordance with the present invention.
Figure 31:
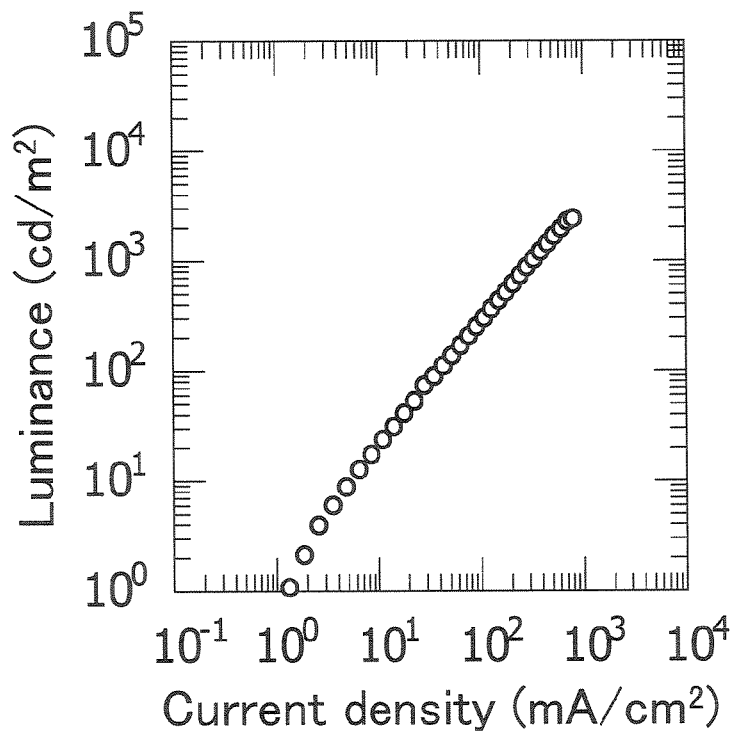
FIG. 31 shows a luminance versus current density characteristic of an organic diode device structure 5 in accordance with the present invention.
Figure 32:
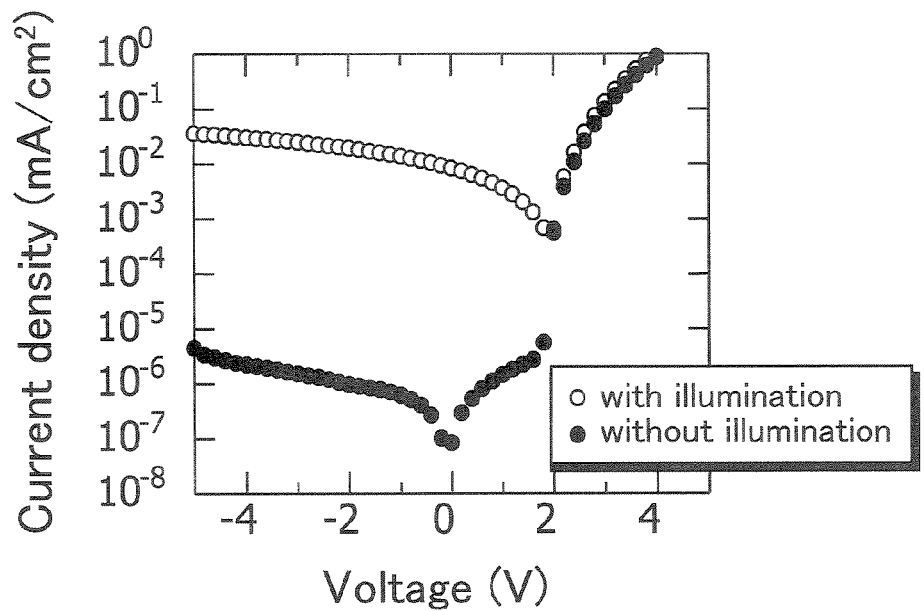
FIG. 32 shows a change of a photodiode characteristic due to illumination of light of an organic diode device structure 5 in accordance with the present invention.
Figure 33:
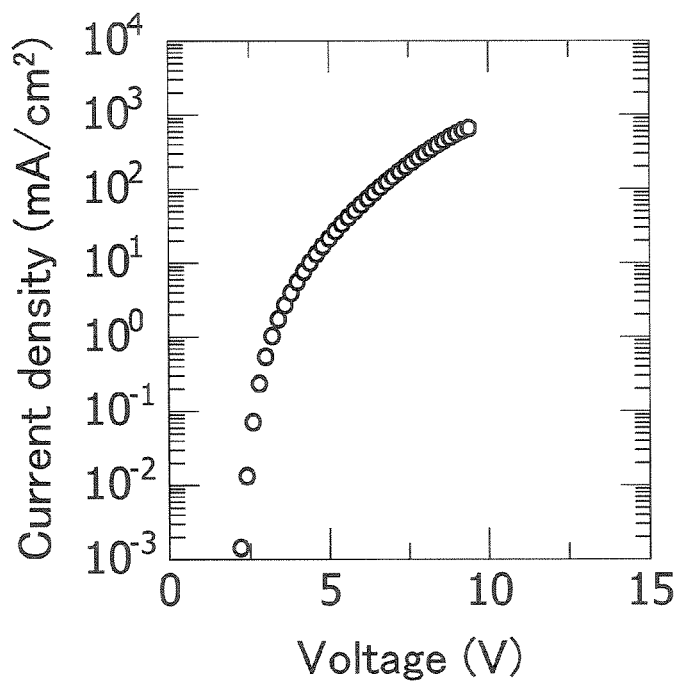
FIG. 33 shows a current density versus voltage characteristic of an organic diode device structure 6 in accordance with the present invention.
Figure 34:
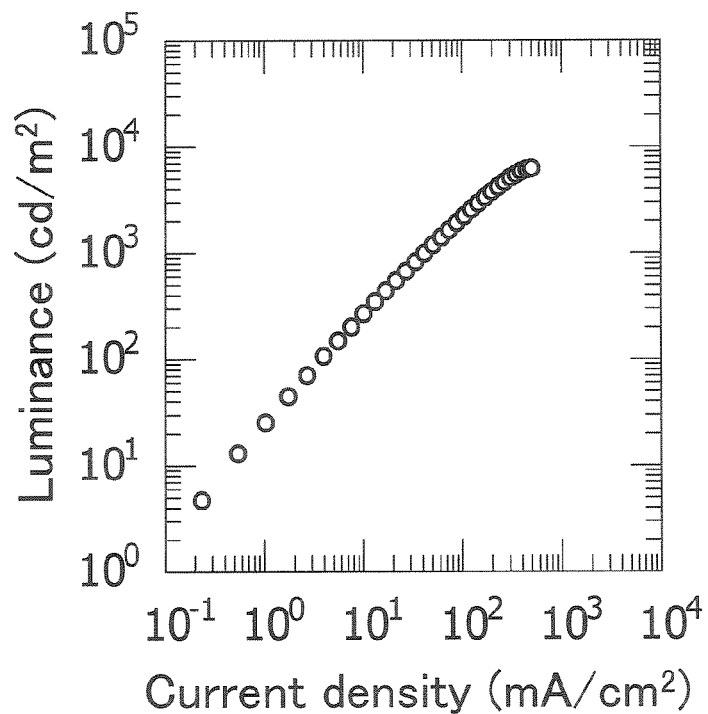
FIG. 34 shows a luminance versus current density characteristic of an organic diode device structure 6 in accordance with the present invention.
Figure 35:
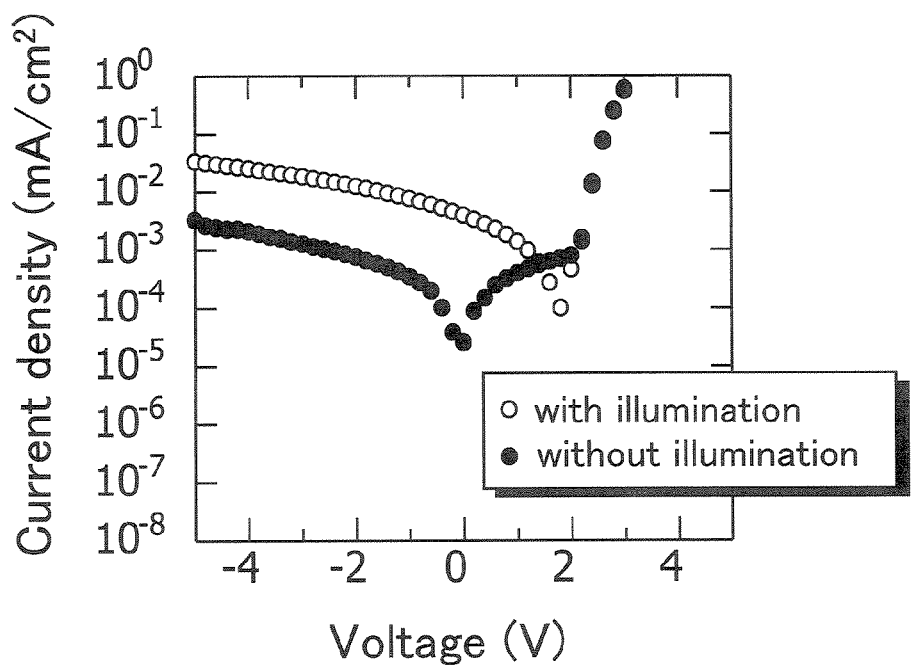
FIG. 35 shows a change of a photodiode characteristic due to illumination of light of an organic diode device structure 6 in accordance with the present invention.

FIG. 18 shows a current density—voltage characteristic [the horizontal axis is voltage (V), and the vertical axis is current density ($mA/cm^2$)] for the device structure 1, FIG. 19 shows a luminance—current density characteristic [the horizontal axis is current density ($mA/cm^2$), and the vertical axis is luminance ($cd/m^2$)] for the device structure 1, and FIG. 20 shows a change of the photodiode characteristics due to light irradiation [the horizontal axis is voltage (V), and the vertical axis is current density ($mA/cm^2$), and open circle ○ and solid circle ● indicate irradiated and dark, respectively.] for the device structure 1. FIG. 21 shows a current density—voltage characteristic [the horizontal axis is voltage (V), and the vertical axis is current density ($mA/cm^2$)] for the device structure 2, FIG. 22 shows a luminance—current density characteristic [the horizontal axis is current density ($mA/cm^2$), and the vertical axis is luminance ($cd/m^2$)] for the device structure 2, and FIG. 23 shows a change of the photodiode characteristics due to light irradiation [the horizontal axis is voltage (V), and the vertical axis is current density ($mA/cm^2$), and open circle ○ and solid circle ● indicate irradiated and dark, respectively.] for the device structure 2. FIG. 24 shows a current density-voltage characteristic [the horizontal axis is voltage (V), and the vertical axis is current density ($mA/cm^2$)] for the device structure 3, FIG. 25 shows a luminance-current density characteristic [the horizontal axis is current density ($mA/cm^2$), and the vertical axis is luminance ($cd/m^2$)] for the device structure 3, and FIG. 26 shows a change of the photodiode characteristics due to light irradiation [the horizontal axis is voltage (V), and the vertical axis is current density ($mA/cm^2$), and open circle ○ and solid circle ● indicate irradiated and dark, respectively.] for the device structure 3. FIG. 27 shows a current density—voltage characteristic [the horizontal axis is voltage (V), and the vertical axis is current density ($mA/cm^2$)] for the device structure 4, FIG. 28 shows a luminance—current density characteristic [the horizontal axis is current density ($mA/m^2$), and the vertical axis is luminance ($cd/m^2$)] for the device structure 4, and FIG. 29 shows a change of the photodiode characteristics due to light irradiation [the horizontal axis is voltage (V), and the vertical axis is current density ($mA/cm^2$), and open circle ○ and solid circle ● indicate irradiated and dark, respectively.] for the device structure 4. FIG. 30 shows a current density—voltage characteristic [the horizontal axis is voltage (V), and the vertical axis is current density ($mA/cm^2$)] for the device structure 5, FIG. 31 shows a luminance—current density characteristic [the horizontal axis is current density ($mA/cm^2$), and the vertical axis is luminance ($cd/m^2$)] for the device structure 5, and FIG. 32 shows a change of the photodiode characteristic due to light irradiation [the horizontal axis is voltage (V), and the vertical axis is current density ($mA/cm^2$), and open circle ○ and solid circle ● indicate irradiated and dark, respectively.] for the device structure 5. FIG. 33 shows a current density-voltage characteristic [the horizontal axis is voltage (V), and the vertical axis is current density (mA/cm$^2$)] for the device structure 6, FIG. 34 shows a luminance—current density characteristic [the horizontal axis is current density (mA/cm$^2$), and the vertical axis is luminance (cd/m$^2$)] for the device structure 6, and FIG. 35 shows a change of the photodiode characteristics due to light irradiation [the horizontal axis is voltage (V), and the vertical axis is current density (mA/cm$^2$), and open circle ○ and solid circle ● indicate irradiated and dark, respectively.] for the device structure 6.

From the characteristics diagram described above, a luminance (at current density=100 mA/cm$^2$) and a conductivity ratio ($\sigma_p/\sigma_d$) for the device structure 1 to 6 are 942 cd/m$^2$ and 4,230, respectively for the device structure 1, 793 cd/m$^2$ and 109, respectively for the device structure 2, 2,190 cd/m$^2$ and 2,210, respectively for the device structure 3, 1,884 cd/m$^2$ and 1,630, respectively for the device structure 4, 280 cd/m$^2$ and 19,900, respectively for the device structure 5, and 2,140 cd/m$^2$ and 16.5, respectively for the device structure 6. Furthermore, the maximum luminance obtained here are 9,300 cd/m$^2$ for the device structure 3, which is a sufficiently large value for an organic EL device. As for the conductivity ratio, the device structure 5 showed a high value. For both a light emission property and a photo sensing property, the device structure 3 showed a good characteristic.

A solar battery characteristic was measured by using a Xe lamp 33 mW/cm$^2$ as a light source, so that the characteristic was different from the characteristic measured conventionally by using the AM1 or AM1.5 solar light 100 mW/cm$^2$ and therefore difficult to compare. By the way, an open voltage was 2V and a short circuit current was 1.93×10$^{-3}$ mA/cm$^2$.

In the following, a characteristic of a device made from the spin coating solution system is described.

A device structure here is IZO/hole transport layer (30 nm)/PPR (110 nm)/BCP (20 nm)/LiF (1 nm)/Al (10 nm), and measurement was done for devices without the hole transport layer (CuPc) (solution type device 1) and with the CuPc (60 nm) (solution type device 2). The solvent was tetrahydrofuran.

Figure 36:
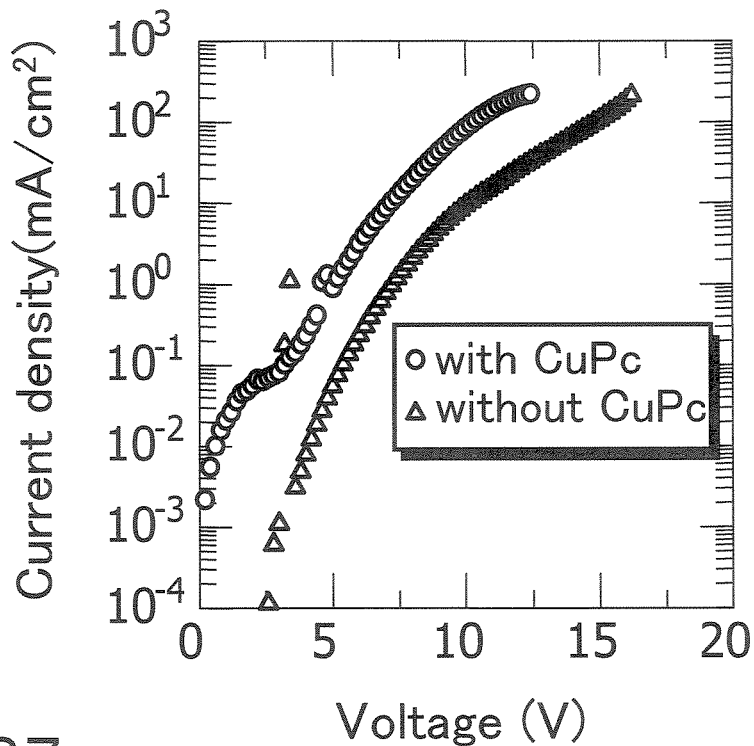
FIG. 36 shows a comparison of a current density versus voltage characteristic of an organic diode liquid type device in accordance with the present invention.
Figure 37:
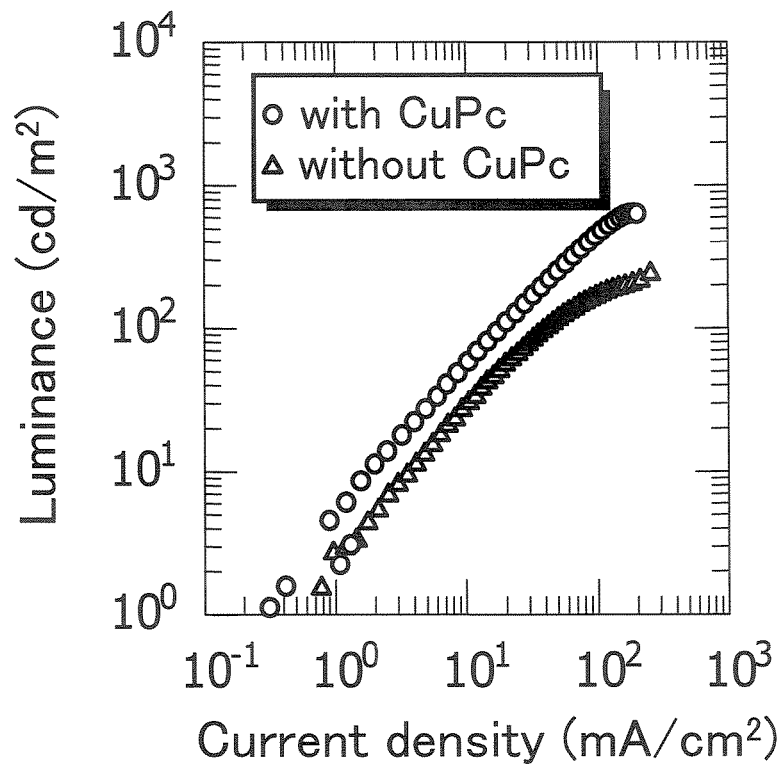
FIG. 37 shows a comparison of a luminance versus current density characteristic of an organic diode liquid type device in accordance with the present invention.
Figure 38:
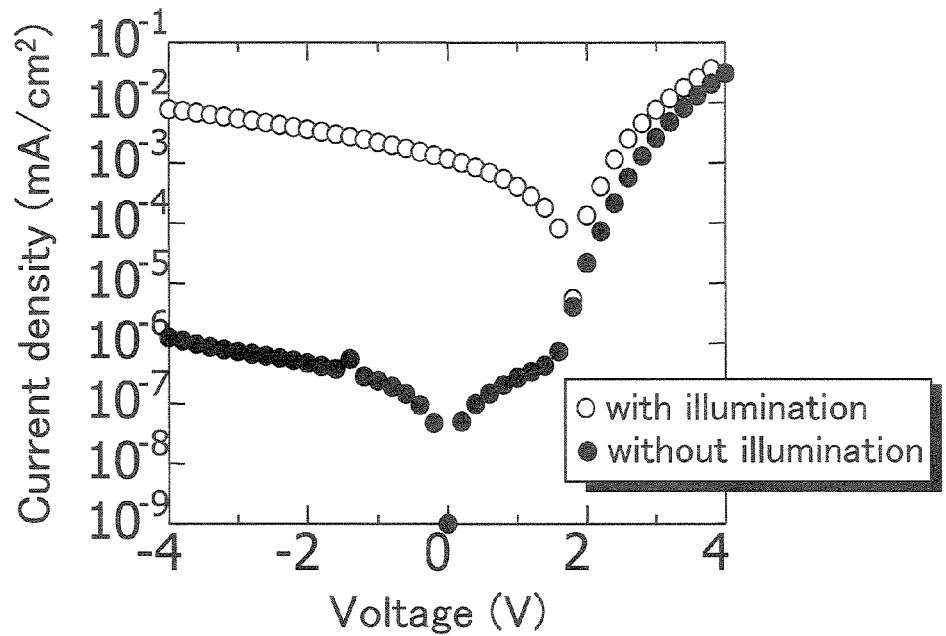
FIG. 38 shows a change of a photodiode characteristic due to illumination of light of an organic diode liquid type device 1 in accordance with the present invention.
Figure 39:
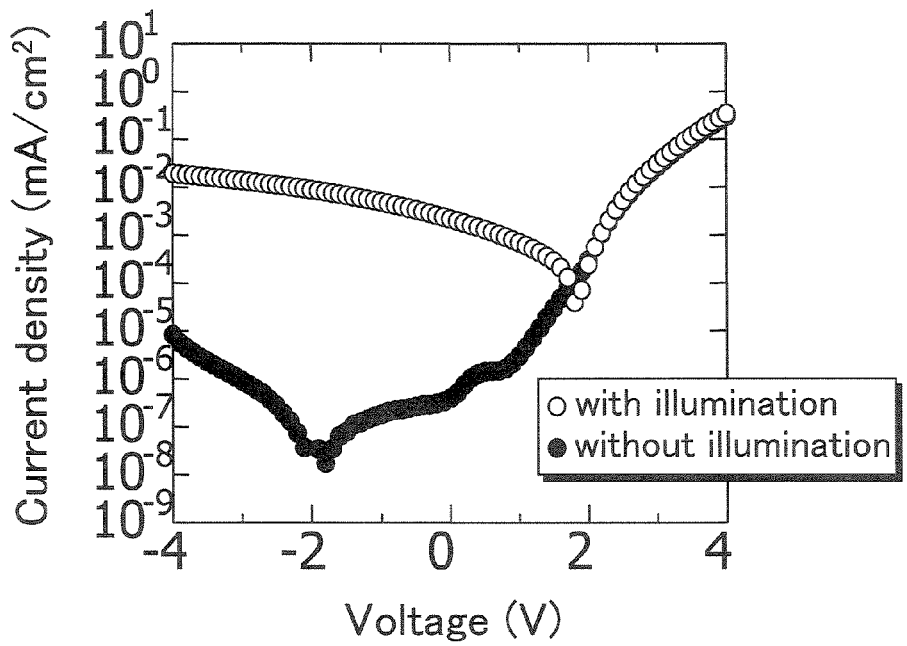
FIG. 39 shows a change of a photodiode characteristic due to illumination of light of an organic diode liquid type device 2 in accordance with the present invention.

FIG. 36 shows a comparison of a current density—voltage characteristic [the horizontal axis is voltage (V), and the vertical axis is current density (mA/m$^2$), and open circle ○ and open triangle △ indicate with and without CuPc, respectively.] for the solution type devices, FIG. 37 shows a comparison of a luminance—current density characteristic [the horizontal axis is current density (mA/m$^2$), and the vertical axis is luminance (cd/m$^2$), and open circle ○ and open triangle △ indicate with and without CuPc, respectively.] for the solution type devices, FIG. 38 shows a change of the photodiode characteristics due to light irradiation [the horizontal axis is voltage (V), and the vertical axis is current density (mA/cm$^2$), and open circle ○ and solid circle ● indicate irradiated and dark, respectively.] for the solution type device 1, and FIG. 39 shows a change of the photodiode characteristics due to light irradiation [the horizontal axis is voltage (V), and the vertical axis is current density (mA/cm$^2$), and open circle ○ and solid circle ● indicate irradiated and dark, respectively.] for the solution type device 2.

From the characteristics diagram described above, a luminance (at current density=100 mA/cm$^2$) and a conductivity ratio $\sigma_p/\sigma_d$ for the solution type devices 1 and 2 are 167 cd/m$^2$ and 7,660, respectively for the solution type device 1, and 457 cd/m$^2$ and 2.51×10$^5$, respectively for the solution type devices 2. Furthermore, the maximum luminance was 640 cd/m$^2$. Although the performance is lower by an order of magnitude as compared with the evaporation type device, light emission/photodetector operation was confirmed by a solution type device with the same organic structure.

By making use of the multifunction organic diode and its matrix panel in accordance with the present invention as described above, a combined function of light emission display by an organic EL display, image sensing by an organic photodiode, and power generation by an organic solar cell is made possible. Thus various application apparatus having functions of displaying, image sensing and power generation, such as a light, thin and flexible television and panel with complex functions, a notebook type personal computer using an ultra thin, integrated structure panel of unified organic EL display/image scanner in which additional light source becomes not required because an organic EL device is used, and furthermore driving part is not necessary to provide, a mobile terminal which is free of recharging, and capable of image read-in, an electronic notice for circulation which is free of a battery or a wall socket and capable of writing, an electronic bulletin board which can emit light under illumination without using a cable, an information display board or an information read-in board which is capable of communicating by using a visible or infra-red light, a full size light emission display which is capable of security check, a light emission sign with sensing function both in daytime and at night, which is free of a battery because a thin film polymer battery or the like is combined, a light emission advertising board which has both functions of a light emission display and reading in the landscape, a thin, optical mouse, and others can be fabricated with a process similar to the production process of the organic EL device without additional process.

The present invention is not limited to the above-described embodiment, various modifications can be made without departing from the scope of the invention, and these modifications shall not be excluded from the scope of the invention.

INDUSTRIAL APPLICABILITY

The multifunction organic diode and its matrix panel in accordance with the present invention has properties of an organic EL, an organic photodetector and an organic solar cell, and a combined function of light emission display by an organic EL display, image sensing by an organic photodiode, and power generation by an organic solar cell is made possible.

The invention claimed is:

1. A multifunction organic diode comprising a first electrode formed on a substrate, an organic thin film formed on the first electrode and having both light emission and photoconductive properties, and a second electrode formed on the organic thin film, and wherein 4-[2-[5-[4-(Diethylamino)phenyl]-4,5-dihydro-1-phenyl-1H-pyrazol-3-yl]-ethenyl]-N,N-diethylaniline is an organic material of the organic thin film, and a light emission operation is accomplished by applying a forward bias between the first electrode and the second electrode, and an optical information detection operation is accomplished by applying a reverse bias between the first electrode and the second electrode, wherein
the organic thin film is an organic thin film of a mixture of a first organic material having a light emission property and a second organic material having a photoconductive property.

2. A multifunction organic diode matrix panel, comprising:
a multifunction organic diode (OD) comprising a first electrode formed on a substrate, an organic thin film formed on the first electrode and having both light emission and photoconductive properties, and a second electrode formed on the organic thin film, and wherein a light emission operation is accomplished by applying a forward bias between the first electrode and the second electrode, and an optical information detection operation is accomplished by applying a reverse bias between the first electrode and the second electrode, the multifunctional organic diode matrix panel configured so that a second storage capacitor (C2), a third transistor (T3), a fourth transistor (T4), the multifunction organic diode (OD) and a cathode line (134) to be grounded are connected in series on a voltage line (133), a first transistor (T1) is connected to a data line (132) and also connected to a first storage capacitor (C1) which is connected to an intermediate point between the second storage capacitor (C2) and the third transistor (T3) and furthermore to a gate electrode of a second transistor (T2), a select line (131) is connected to the first transistor (T1), a first timing signal line (136) is connected to a gate electrode of the third transistor (T3), and a second timing signal line (137) is connected to a gate electrode of the fourth transistor (T4), and a complex line (135) for a power supply and a signal output is connected to the second transistor (T2) which is connected in series to the fourth transistor (T4), the multifunction organic diode (OD) and the cathode line (134) to be grounded, wherein during a first selected period, the third transistor (T3) is conductive, the second transistor (T2) is made as a diode with the threshold voltage of the second transistor (T2) written into the gate electrode of the second transistor (T2) while holding the voltage value by the second storage capacitor (C2), and by applying an analog signal voltage to a gate electrode of the first transistor (T1) during a period in which a selection signal is given, the signal voltage is superimposed to the gate voltage of the second transistor (T2) through the capacitive coupling of the first storage capacitor (C1), and the fourth transistor (T4) is selected, thereby emitting light from the multifunction organic diode (OD) under forward bias, wherein during another selected period, the third transistor (T3) is conductive, the second transistor (T2) is made as a diode with the threshold voltage of the second transistor (T2) written into the gate electrode of the second transistor (T2) while holding the voltage value by the second storage capacitor (C2), wherein by applying an analog signal voltage to a gate electrode of the first transistor (T1) during a period in which a selection signal is given, a signal voltage is superimposed through the capacitive coupling of the first storage capacitor (C1) to the gate voltage of the second transistor (T2), thereby making the second transistor (T2) conductive, and wherein when the fourth transistor (T4) is selected, a current in proportion to the incident amount of light irradiation flows from the multifunction organic diode (OD) under reverse bias through the second and the fourth transistors (T2) and (T4), thereby enabling signal detection through an outer peripheral circuit.

3. A multifunction organic diode matrix panel, comprising:

a multifunction organic diode (OD) comprising a first electrode formed on a substrate, an organic thin film formed on the first electrode and having both light emission and photoconductive properties, and a second electrode formed on the organic thin film, and wherein a light emission operation is accomplished by applying a forward bias between the first electrode and the second electrode, and an optical information detection operation is accomplished by applying a reverse bias between the first electrode and the second electrode, the multifunctional organic diode matrix panel configured so that a series connection of a fourth transistor (T4), a third transistor (T3), the multifunction organic diode (OD) and a cathode line (143) to be grounded is connected to a complex line (144) for a power supply and a signal output, a second transistor (T2) is connected to a data line (142) and also connected to an intermediate point between the fourth transistor (T4) and the third transistor (T3), a first transistor (T1) is also connected to the data line (142) and to a gate electrode of the third transistor (T3) and to a storage capacitor (C1) which is connected to an intermediate point between the third transistor (T3) and the multifunction organic diode (OD), and a first select line (141) is connected to a gate electrode of the second transistor (T2) and to a gate electrode of the first transistor (T1), and a second select line (145) is connected to a gate electrode of the fourth transistor (T4), wherein during a first selected period, the first transistor (T1) and the second transistor (T2) are conductive, and a voltage in proportion to the flowing analog voltage is written into a gate electrode of the third transistor (T3) and the first storage capacitor (C1), wherein during a second period, the fourth transistor (T4) is conductive and through the third transistor (T3) which is biased in advance the multifunction organic diode (OD) which is biased in the forward direction emits light, and wherein during another selected period, the first transistor (T1) and the second transistor (T2) are conductive, and a voltage in proportion to the flowing analog current is written into a gate electrode of the third transistor (T3) and the first storage capacitor (C1), and the fourth transistor (T4) is selected, and a current in proportion to the incident amount of light flows through the multifunction organic diode (OD) biased in the reverse direction via the third transistor (T3) and the fourth transistor (T4), thereby enabling current signal detection through an outside peripheral circuit.

4. A multifunction organic diode matrix panel, comprising:

a multifunction organic diode (OD) comprising a first electrode formed on a substrate, an organic thin film formed on the first electrode and having both light emission and photoconductive properties, and a second electrode formed on the organic thin film, and wherein a light emission operation is accomplished by applying a forward bias between the first electrode and the second electrode, and an optical information detection operation is accomplished by applying a reverse bias between the first electrode and the second electrode, the multifunctional organic diode matrix panel configured so that a series connection of a second transistor (T2), the multifunction organic diode (OD) and a cathode line (154) to be grounded is connected to a complex line (155) for a power supply and a signal output, and a data line (152) is connected in series with a first transistor (T1) and a third transistor (T3), and a select line (151) is connected to a gate electrode of the first transistor (T1) and to a gate electrode of the third transistor (T3) ,and a storage capacitor (C) which is connected to a power supply line (153) is connected to the third transistor (T3), and a fourth transistor (T4) is connected to the power supply line (153) and also connected to an intermediate point between the first transistor (T1) and the third transistor (T3), and the storage capacitor (C) is also connected to a gate electrode of the fourth transistor (T4) and to a gate electrode of the second transistor (T2), wherein during a period where the first transistor (T1) and the third transistor (T3) are conductive, a current data is written into the storage capacitor (C) through the data line (152) using a pinch-off state of the fourth transistor (T4), wherein during a second period, by making the first transistor (T1) and the third transistor (T3) non-conductive, and by letting a current flow through the second transistor (T2) biased in advance, thereby emitting light from the multifunction organic diode (OD) under forward bias, wherein during another selected period, the first transistor (T1) and the third transistor (T3) are conductive, and a current flows through the storage capacitor (C) through the data line (152) using the pinch-off state of the fourth transistor (T4), thereby the second transistor (T2) and the fourth transistor (T4) are made conductive, and wherein the first transistor (T1) and the third transistor (T3) are non-conductive, and a current flows through the second transistor (T2) biased in advance, thereby enabling to detect a current from the multifunction organic diode (OD) biased in the reverse direction.

5. The multifunction organic diode in accordance with claim 1, wherein a difference between a wavelength of the maximum light emission intensity and a wavelength of the maximum optical absorption of the organic thin film is larger than or equal to sum of the half width in wavelength at half maximum of the light emission and the half width in wavelength at half maximum of the optical absorption.

6. The multifunction organic diode in accordance with claim 1, wherein a difference between a wavelength of the maximum light emission intensity and a wavelength of the maximum optical absorption of the organic thin film of a mixture of the first organic material and the second organic material is larger than or equal to sum of the half width in wavelength at half maximum of the light emission and the half width in wavelength at half maximum of the optical absorption.

7. The multifunction organic diode in accordance with claim 1, wherein the absorption coefficient of the organic thin film for the visible emitting light is less than $2.5 \times 10^4$ cm$^{-1}$, and the maximum absorption coefficient for the absorptive light of the organic thin film is greater than or equal to $2.5 \times 10^4$ cm$^{-1}$, and wherein a film thickness of the organic thin film is less than or equal to 150 nm.

8. The multifunction organic diode in accordance with claim 1, wherein the absorption coefficient of the organic thin film for the visible emitting light is less than $2.5 \times 10^4$ cm$^{-1}$, or the maximum absorption coefficient of the organic thin film for the absorptive light is greater than or equal to $2.5 \times 10^4$ cm$^{-1}$, and wherein a film thickness of the organic thin film is less than or equal to 150 nm.

9. The multifunction organic diode in accordance with claim 2, 3, or 4, wherein a difference between a wavelength of the maximum light emission intensity and a wavelength of the maximum optical absorption of the organic thin film is larger than or equal to sum of the half width in wavelength at half maximum of the light emission and the half width in wavelength at half maximum of the optical absorption.

10. The multifunction organic diode in accordance with claim 2, 3 or 4, wherein the organic thin film is an organic thin film of a mixture of a first organic material having a light emission property and a second organic material having a photoconductive property.

11. The multifunction organic diode in accordance with claim 10, wherein a difference between a wavelength of the maximum light emission intensity and a wavelength of the maximum optical absorption of the organic thin film of a mixture of the first organic material and the second organic material is larger than or equal to sum of the half width in wavelength at half maximum of the light emission and the half width in wavelength at half maximum of the optical absorption.

12. The multifunction organic diode in accordance with claim 2, 3, or 4, wherein the absorption coefficient of the organic thin film for the visible emitting light is less than $2.5 \times 10^4$ cm$^{-1}$, and the maximum absorption coefficient for the absorptive light of the organic thin film is greater than or equal to $2.5 \times 10^4$ cm$^{-1}$, and wherein a film thickness of the organic thin film is less than or equal to 150 nm.

13. The multifunction organic diode in accordance with claim 2, 3, or 4, wherein the absorption coefficient of the organic thin film for the visible emitting light is less than $2.5 \times 10^4$ cm$^{-1}$, or the maximum absorption coefficient of the organic thin film for the absorptive light is greater than or equal to $2.5 \times 10^4$ cm$^{-1}$, and wherein a film thickness of the organic thin film is less than or equal to 150 nm.

14. The multifunction organic diode in accordance with claim 2, 3, or 4, wherein an organic thin film which is a mixture of the organic material of said organic thin film and an organic material having a property as a host material is at least a part of the organic thin film.

15. The multifunction organic diode in accordance with claim 2, 3, or 4, wherein the first electrode is transparent to a visible light.

16. The multifunction organic diode in accordance with claim 2, 3, or 4, wherein the second electrode is transparent to a visible light.

17. The multifunction organic diode in accordance with claim 2, 3, or 4, wherein both the first electrode and the second electrode are transparent to a visible light.

18. The multifunction organic diode in accordance with claim 2, 3, or 4, wherein 4-[2-[5-[4-(Diethylamino)phenyl]-4,5-dihydro-1-phenyl-1H-pyrazol-3-yl]-ethenyl]-N,N-diethylaniline is an organic material of the organic thin film.

19. A multifunction organic diode comprising:
a first electrode formed on a substrate,
a first organic thin film formed on the first electrode and having a light emission property;
a second organic thin film formed on the first organic thin film and having a photoconductive property, and
a second electrode formed on the second organic thin film,
wherein 4-[2-[5-[4-(Diethylamino)phenyl]-4,5-dihydro-1-phenyl-1H-pyrazol-3-yl]-ethenyl]-N,N-diethylaniline is an organic material of the first organic thin film having a light emission property, and wherein a light emission operation is accomplished by applying a forward bias between the first electrode and the second electrode, and an optical information detection operation is accomplished by applying a reverse bias between the first electrode and the second electrode.

20. A multifunction organic diode, comprising;
a first electrode formed on a substrate,
a first organic thin film formed on the first electrode and having a light emission property;
a second organic thin film formed on the first organic thin film and having a photoconductive property and
a second electrode formed on the second organic thin film,
wherein 4-[2-[5-[4-(Diethylamino)phenyl]-4,5-dihydro-1-phenyl-1H-pyrazol-3-yl]-ethenyl]-N,N-diethylaniline is an organic material of the second organic thin film having a photoconductive property, and wherein a light emission operation is accomplished by applying a forward bias between the first electrode and the second electrode, and an optical information detection operation is accomplished by applying a reverse bias between the first electrode and the second electrode.

21. A multifunction organic diode, comprising:
a first electrode formed on a substrate,
a first organic thin film formed on the first electrode and having a photoconductive property;
a second organic thin film formed on the first organic thin film and having a light emission property, and
a second electrode formed on the second organic thin film, wherein 4-[2-[5-[4-(Diethylamino)phenyl]-4,5-dihydro-1-phenyl-1H-pyrazol-3-yl]-ethenyl]-N,N-diethylaniline is an organic material of the first organic thin film having a photoconductive property, and wherein a light emission operation is accomplished by applying a forward bias between the first electrode and the second electrode, and an optical information detection operation is accomplished by applying a reverse bias between the first electrode and the second electrode.

22. A multifunction organic diode, comprising:
a first electrode formed on a substrate,
a first organic thin film formed on the first electrode and having a photoconductive property;
a second organic thin film formed on the first organic thin film and having a light emission property, and
a second electrode formed on the second organic thin film, wherein 4-[2-[5-[4-(Diethylamino)phenyl]-4,5-dihydro-1-phenyl-1H-pyrazol-3-yl]-ethenyl]-N,N-diethylaniline is an organic material of the second organic thin film having a light emission property, and wherein a light emission operation is accomplished by applying a forward bias between the first electrode and the second electrode, and an optical information detection operation is accomplished by applying a reverse bias between the first electrode and the second electrode.

23. A multifunction organic diode comprising a first electrode formed on a substrate, an organic thin film which is a mixture of a first organic material having a light emission property and a second organic material having a photoconductive property and formed on the first electrode, and a second electrode formed on the organic thin film, wherein 4-[2-[5-[4-(Diethylamino)phenyl]-4,5-dihydro-1-phenyl-1H-pyrazol-3-yl]-ethenyl]-N,N-diethylaniline is the first organic material having a light emission property, and wherein a light emission operation is accomplished by applying a forward bias between the first electrode and the second electrode, and an optical information detection operation is accomplished by applying a reverse bias between the first electrode and the second electrode.

24. A multifunction organic diode comprising a first electrode formed on a substrate, an organic thin film which is a mixture of a first organic material having a light emission property and a second organic material having a photoconductive property and formed on the first electrode, and a second electrode formed on the organic thin film, wherein 4-[2-[5-[4-(Diethylamino)phenyl]-4,5-dihydro-1-phenyl-1H-pyrazol-3-yl]-ethenyl]-N,N-diethylaniline is the second organic material having a photoconductive property, and wherein a light emission operation is accomplished by applying a forward bias between the first electrode and the second electrode, and an optical information detection operation is accomplished by applying a reverse bias between the first electrode and the second electrode.

* * * * *